United States Patent
Schwab et al.

(10) Patent No.: US 11,404,359 B2
(45) Date of Patent: Aug. 2, 2022

(54) LEADFRAME PACKAGE WITH ISOLATION LAYER

(71) Applicant: Infineon Technologies AG, Neubiberg (DE)

(72) Inventors: Stefan Schwab, Regensburg (DE); Alexander Roth, Zeitlarn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/073,931

(22) Filed: Oct. 19, 2020

(65) Prior Publication Data

US 2022/0122905 A1    Apr. 21, 2022

(51) Int. Cl.
| | |
|---|---|
| *H01L 23/495* | (2006.01) |
| *H01L 21/48* | (2006.01) |
| *H01L 21/56* | (2006.01) |
| *H01L 23/29* | (2006.01) |
| *H01L 23/31* | (2006.01) |

(52) U.S. Cl.
CPC .... *H01L 23/49568* (2013.01); *H01L 21/4814* (2013.01); *H01L 21/565* (2013.01); *H01L 23/293* (2013.01); *H01L 23/3157* (2013.01); *H01L 23/49506* (2013.01); *H01L 23/49558* (2013.01); *H01L 23/49562* (2013.01); *H01L 23/49586* (2013.01)

(58) Field of Classification Search
CPC ............. H01L 23/49568; H01L 23/293; H01L 23/3157; H01L 23/49506; H01L 23/49558; H01L 23/49562; H01L 23/49586

See application file for complete search history.

(56) References Cited

U.S. PATENT DOCUMENTS

| | | | |
|---|---|---|---|
| 2006/0091512 A1* | 5/2006 | Shinohara | H01L 23/4334 257/E23.044 |
| 2006/0113562 A1* | 6/2006 | Jeun | H01L 23/49575 257/676 |
| 2011/0068445 A1* | 3/2011 | Lin | H01L 24/83 438/122 |
| 2013/0285222 A1 | 10/2013 | Park | |
| 2018/0076116 A1 | 3/2018 | Prakuzhy et al. | |

\* cited by examiner

*Primary Examiner* — Peniel M Gumedzoe
(74) *Attorney, Agent, or Firm* — Dicke, Billig & Czaja, PLLC

(57) ABSTRACT

An integrated circuit package that includes a leadframe and a mold compound encapsulating at least a portion of the leadframe. The mold compound includes a cavity open at a bottom surface of the mold compound that exposes a bottom surface of the leadframe. A thermally conductive and electrically insulating isolation layer is locked within the bottom cavity of the mold compound and contacts the bottom surface of the leadframe.

28 Claims, 14 Drawing Sheets

LEADFRAME PACKAGE WITH ISOLATION LAYER

FIELD OF TECHNOLOGY

The present application relates to a package that includes a leadframe that is at least partially encapsulated by a mold compound. More specifically, the present disclosure relates to a thermally conductive and electrically insulating isolation layer locked within a cavity of the mold compound.

BACKGROUND

Conventional external isolation layers for molded packages can have adhesion problems if leadframe die pads at a surface of the package mold compound need to be isolated using a single isolation layer. This occurs because it can be difficult to adhere the isolation layer to surfaces of the mold compound that are between or around the exposed die pads. The adhesion problem arises because the isolation layer and the mold compound have different material properties.

For these and other reasons, there is a need for the present invention.

SUMMARY

According to an embodiment of an integrated circuit package, the package includes a leadframe and a mold compound encapsulating at least a portion of the leadframe. The mold compound includes a cavity open at a bottom surface of the mold compound that exposes a bottom surface of the leadframe. A thermally conductive and electrically insulating isolation layer is locked within the bottom cavity of the mold compound and contacts the bottom surface of the leadframe.

According to an embodiment of a leadframe module, the leadframe module includes a leadframe with a first die pad and a second die pad. A first power semiconductor die is attached to a top surface of the first die pad and a second power semiconductor die is attached to a top surface of the second die pad. A mold compound encapsulates the first power semiconductor die, the second power semiconductor die, and at least a portion of the leadframe. The mold compound includes a first cavity open at a bottom surface of the mold compound that exposes a bottom surface of the first die pad, where the first cavity includes an etched first undercut spaced at a first distance above the bottom surface of the mold compound. A thermally conductive and electrically insulating first isolation layer fills the first cavity and the first undercut. Filling the first undercut of the first cavity locks the first isolation layer within the first cavity. The mold compound includes a second cavity open at the bottom surface of the mold compound that exposes a bottom surface of the second die pad, where the second cavity includes an etched second undercut spaced at a second distance above the bottom surface of the mold compound. A thermally conductive and electrically insulating second isolation layer fills the second cavity and the second undercut. Filling the second undercut of the second cavity locks the second isolation layer within the second cavity.

According to an embodiment of a method of forming an integrated circuit package, the method includes providing a leadframe that includes a die pad, a semiconductor die attached to a top surface of the die pad and a mold compound encapsulates the semiconductor die and the die pad. The die pad includes a bottom surface exposed at a bottom surface of the mold compound, where at least one side surface of the die pad includes a protruding part that extends in a transverse direction away from the at least one side surface. The protruding part is below the top surface of the die pad and above the bottom surface of the mold compound. The method includes forming a cavity within the bottom surface of the mold compound by etching the bottom surface of the die pad to a distance above the bottom surface of the mold compound that includes etching at least a portion of the protruding part. The method includes filling the cavity with a thermally conductive and electrically insulating isolation layer.

According to an embodiment of a method of forming an integrated circuit package, the method includes providing a leadframe that includes a die pad, a semiconductor die attached to a top surface of the die pad and a sacrificial layer abutting a bottom surface of the die pad. A mold compound encapsulates the semiconductor die, the die pad and the sacrificial layer, and a bottom surface of the sacrificial layer is exposed at a bottom surface of the mold compound. At least one side surface of the sacrificial layer includes a protruding part spaced above a bottom surface of the mold compound. The protruding part extend ends in a transverse direction away from the at least one side surface. The method includes removing the sacrificial layer including the protruding part to form a cavity that is open at the bottom surface of the mold compound and that exposes a bottom surface of the die pad. Removal of the protruding part of the sacrificial layer forms an undercut within the cavity. The method includes filling the cavity with a thermally conductive and electrically insulating isolation layer.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
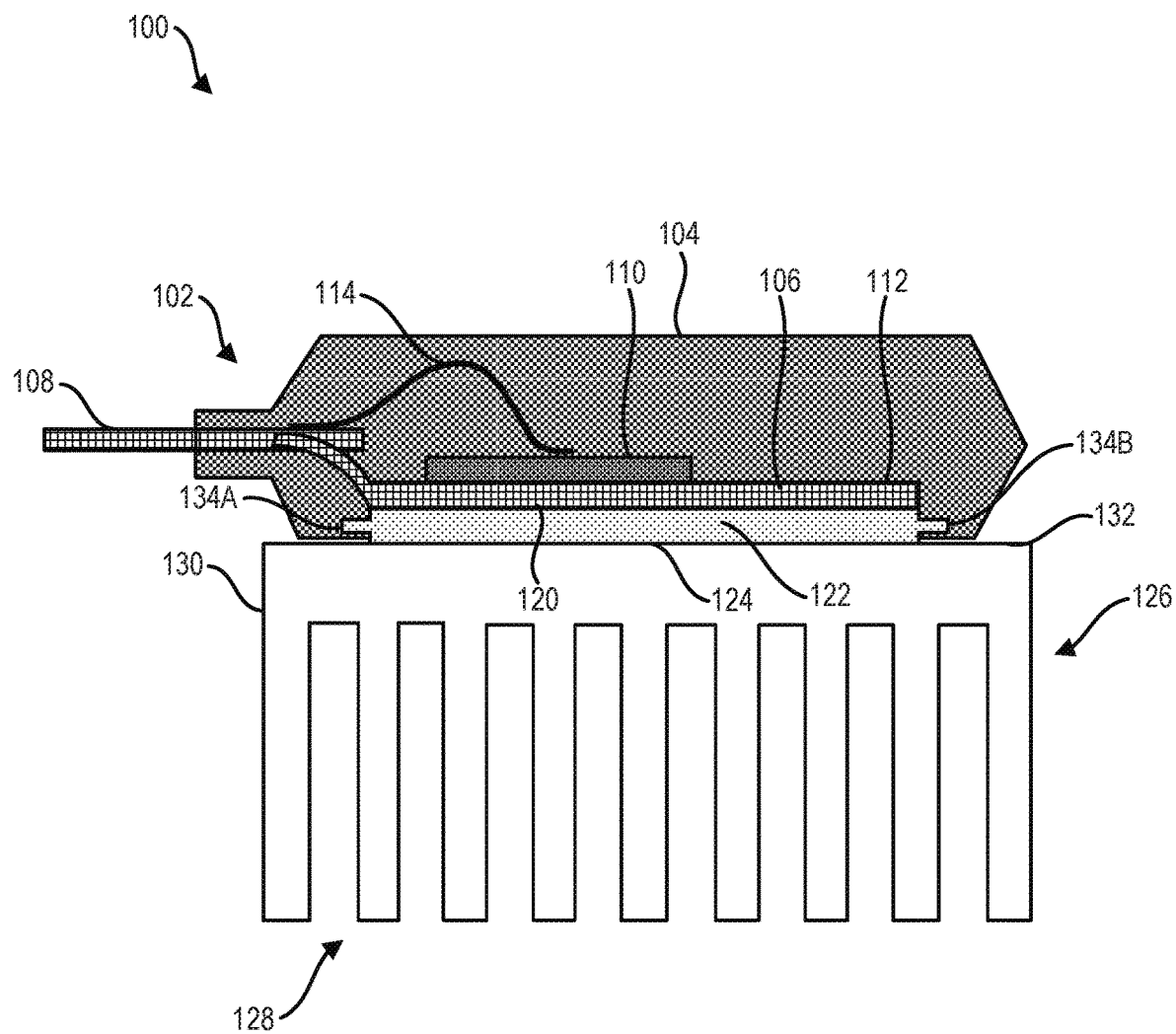
FIG. 1 illustrates an embodiment of a cross-sectional view of an integrated circuit package.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing", "upper," "lower", "right", "left", "vertical," "horizontal" etc., is used with reference to the orientation of the Figure(s) being described. Because components of embodiments can be positioned in a number of different orientations, the directional terminology is used for purposes of illustration and is in no way limiting.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Furthermore, the word "over" used with regard to a part, element or material layer formed or located "over" a surface may be used herein to mean that the part, element or material layer be located (e.g. placed, formed, deposited, etc.) indirectly on the implied surface with the part, element or material layer or layers being arranged between the implied surface and the part, element or material layer. However, the word "over" used with regard to a part, element or material layer formed or located "over" a surface may optionally also have the specific meaning that the part, element or material layer be located (e.g. placed, formed, deposited, etc.) directly on, e.g. in direct contact with, the implied surface.

The semiconductor die may be of different types, may be manufactured by different technologies and may include, for example, integrated electrical, electro-optical or electro-mechanical circuits and/or passive devices. The semiconductor die may, for example, be logic integrated circuits, analog integrated circuits, mixed signal integrated circuits, power integrated circuits, memory circuits or passive devices. They may include control circuits, microprocessors or microelectromechanical components. The semiconductor die may be power semiconductor die that include, but are not limited to, Metal Oxide Semiconductor Field-effect Transistors (MOSFETs), Insulated Gate Bipolar Transistors (IGBTs), Gallium Nitride (GaN) devices, Silicon Carbide (SiC) devices, Junction Gate Field Effect Transistors (JFETs), as well as power bipolar transistors or power diodes.

The integrated circuit packages, lead frames and lead frame modules described herein include packages such as a Transistor Outline (TO) package, a Quad Flat No Leads Package (QFN) package, a Small Outline (SO) package, a Small Outline Transistor (SOT) package, a Thin Small Outline Package (TSOP) package, a Dual Small Outline Package (DSO) and a Double Sided Cooling (DSC) package. The lead frame modules can include multiple semiconductor die on a same die pad or on different die pads of the lead frame module.

It is to be understood that the features of the various exemplary embodiments described herein may be combined with each other, unless specifically noted otherwise. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 illustrates an embodiment of a cross-sectional view of an integrated circuit package at 100. Integrated circuit package 100 is a Transistor Outline (TO) package and includes a leadframe 102 and a mold compound 104 that encapsulates at least a portion of the leadframe 102. Although the embodiment described in FIG. 1 relates to a TO package, integrated circuit package 100 can be any other suitable type of package that includes, but is not limited to, a QFN package, an SO package, a SOT package, a TSOP package, a DSO package, a DSC package and a leadframe module. In the illustrated embodiment, the mold compound 104 is a polymer mold compound or an epoxy mold compound. Lead frame 102 includes a die pad 106 and leads 108. In the illustrated embodiment, leadframe 102 is a copper (Cu) leadframe. In other embodiments, leadframe 102 can be formed from other suitable materials that include, but are not limited to, aluminum (Al), nickel (Ni), iron (Fe) and steel.

In the illustrated embodiment, a semiconductor die 110 is attached to a top surface 112 of the die pad 106. Semiconductor die 110 is attached to leads 108 via wire bonds 114. A bottom cavity 116 is open at a bottom surface 118 of mold compound 104 and cavity 116 exposes a bottom surface 120 of die pad 106 (refer to FIG. 2). A thermally conductive and electrically insulating isolation layer 122 is locked within cavity 116. In the illustrated embodiment, isolation layer 122 is a polymer isolation layer. In various embodiments, isolation layer 122 can be formed from suitable materials that include, but are not limited to, polymer ceramic materials, cement materials and highly filled polymers, such as epoxies, silicones or rubbers, that are filled with silicon dioxide ($SiO_2$), aluminum oxide ($Al_2O_3$), aluminum nitride (AlN), boron nitride (BN), zinc oxide (ZnO) and/or magnesium oxide (MgO). In the illustrated embodiment, isolation layer 122 has a thickness that is within a range of approximately 100 microns to 500 microns in a direction that is perpendicular to a plane of the bottom surface 118 of mold compound 104. In other embodiments, isolation layer 122 has a thickness that is either less than 100 microns or greater than 500 microns. Isolation layer 122 contacts a bottom surface 120 of die pad 106 and contacts interior surfaces of bottom cavity 116. Isolation layer 122 has a lower surface 124 that is exposed at the bottom surface 118 of mold compound 104. In the illustrated embodiment, isolation layer 122 fills cavity 116 such that all angles between intersecting or adjacent portions of isolation layer 122 and cavity 116 are the same.

In the illustrated embodiment, a heatsink 126 is attached to a bottom side of integrated circuit package 100. Heat sink 126 is formed from a thermally conductive material such as copper or aluminum, and has a plurality of cooling fins 128 extending from a base 130 of heat sink 126. A top surface 132 of heat sink 126 is in thermally conductive contact with lower surface 124 of isolation layer 122 and operates to remove heat generated by semiconductor die 110.

Figure 2:
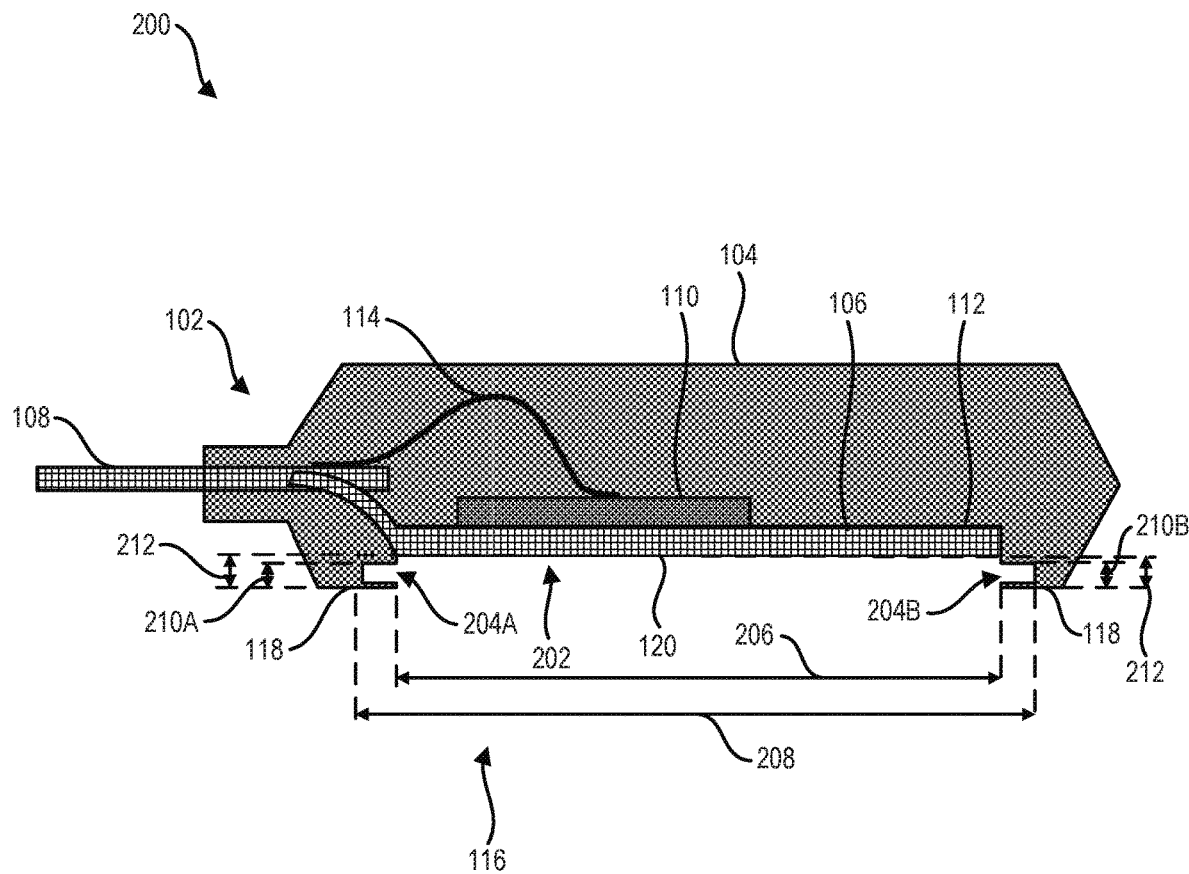
FIG. 2 illustrates an embodiment of a cross-sectional view of an integrated circuit package.

FIG. 2 illustrates an embodiment of a cross-sectional view of an integrated circuit package at 200. Integrated circuit package 200 is the integrated circuit package 100 illustrated in FIG. 1 but does not include isolation layer 122 or heat sink 126. In other embodiments, integrated circuit package 200 can be any suitable type of package as described herein. In the illustrated embodiment, cavity 116 has an opening 202 at the bottom surface 118 of mold compound 104 and includes one or more etched undercuts as illustrated at 204A and 204B. Although two etched undercuts 204A and 204B are illustrated in FIG. 2, in other embodiments, cavity 116 can have one etched undercut or three or more etched undercuts. Although the two etched undercuts 204A and 204B are illustrated as rectangular in shape, in other embodiment, the etched undercuts 204A and 204B can have other suitable shapes.

In the illustrated embodiment, opening 202 of cavity 116 at the bottom surface 118 of the mold compound 104 has a width illustrated at 206 that is less than a width illustrated at 208 of the cavity 116 at a distance 210A of the undercut 204A from the bottom surface 118 of mold compound 104, or at a distance 210B of the undercut 204B from the bottom surface 118 of mold compound 104. Widths 206 and 208 are measured in a direction that is parallel with a plane of the bottom surface 118 of mold compound 104.

Figure 4:
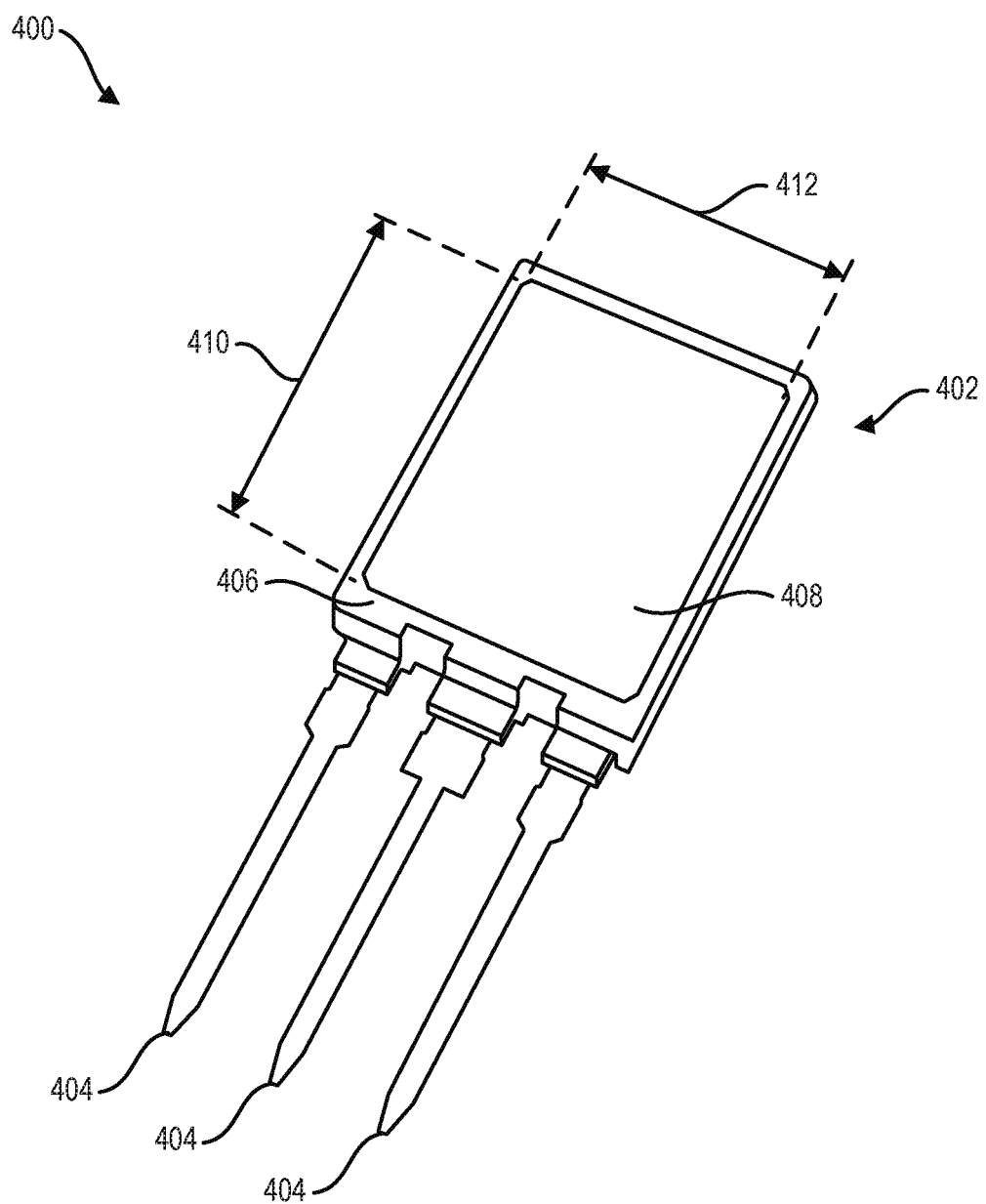
FIG. 4 illustrates an embodiment of a perspective view of an integrated circuit package.
Figure 6A:
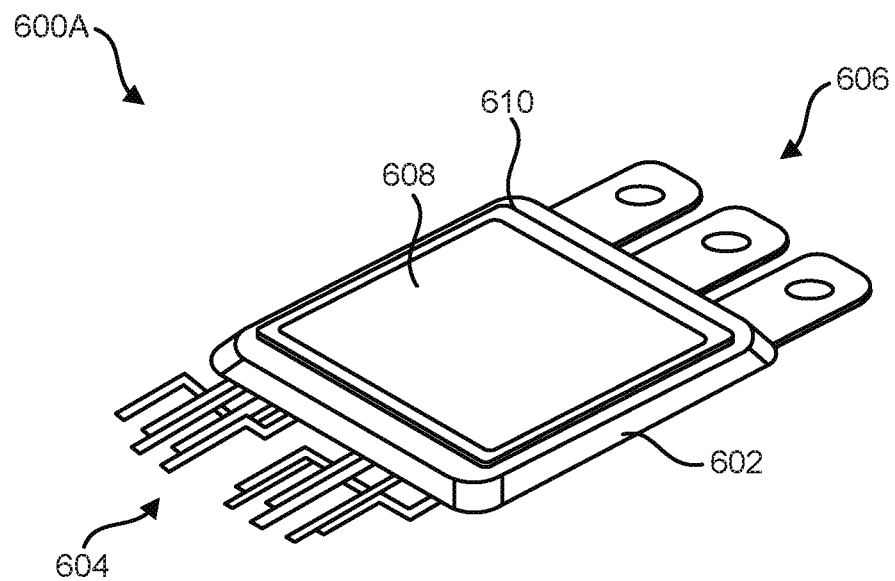
FIGS. 6A-6B illustrate embodiments of a top perspective view and a bottom view of an integrated circuit package.
Figure 6B:
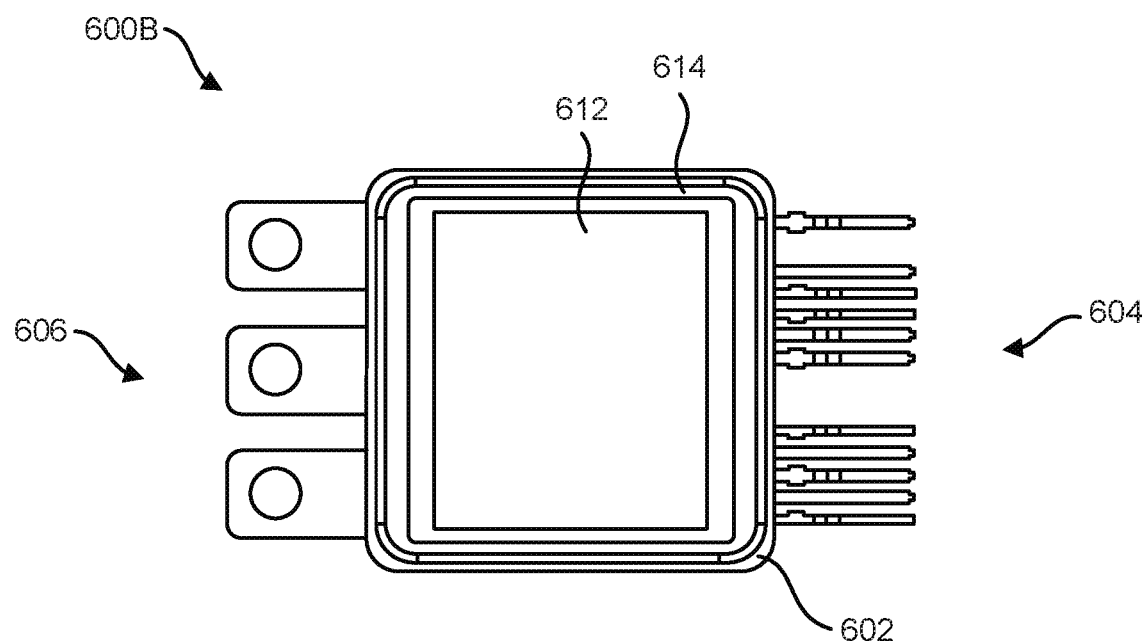

In the illustrated embodiment, opening 202 of cavity 116 and the corresponding lower surface 124 of isolation layer 122 have a rectangular or square shape (see also, FIGS. 4 and 6A-6B). In other embodiments, opening 202 of cavity 116 and lower surface 124 of isolation layer 122 can have other suitable shapes.

Isolation layer 122 includes protrusions 134A and 134B that are within or fill respective undercuts 204A and 204B (see also, FIG. 1). As such, isolation layer 122 has a width 206 at opening 202 of cavity 116 that is less than a width 208 of isolation layer 122 at distance 210A and/or distance 210B (see also, FIG. 1). The difference between width 206 and width 208 mechanically locks or retains isolation layer 122 within cavity 116 in reference to a direction that is perpendicular to a plane of the bottom surface 118 of mold compound 104.

In the illustrated embodiment, distance 210A is equal to distance 210B. Distance 210A and distance 210B are less than a distance illustrated at 212 between the bottom surface 120 of die pad 106 and the bottom surface 118 of mold compound 104. In other embodiments, distance 210A is not equal to distance 210B. In other embodiments, distance 210A and distance 210B are equal to distance 212.

In the illustrated embodiment, isolation layer 122 fills cavity 116 and the undercuts 204A and 204B such that all angles between intersecting or adjacent portions of isolation layer 122 and cavity 116 are the same. Lower surface 124 of isolation layer 122 is approximately coplanar with the bottom surface 118 of mold compound 104. In other embodiments, lower surface 124 of isolation layer 122 is below the bottom surface 118 of mold compound 104 (see also, FIG. 8). In other embodiments, isolation layer 122 does not completely fill cavity 116 but contacts the bottom surface 120 of die pad 106 and has a lower surface 124 that is approximately coplanar with the bottom surface 118 of mold compound 104 or is below the lower surface 118 of mold compound 104.

Figure 3A:
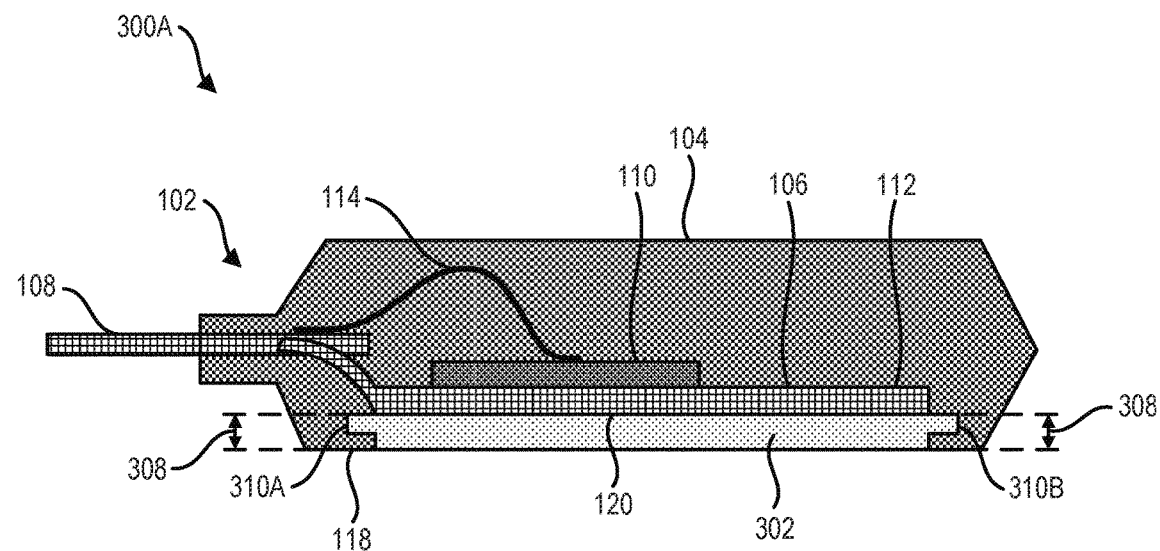
FIGS. 3A-3B illustrate an embodiment of a cross-sectional view of an integrated circuit package.
Figure 3B:
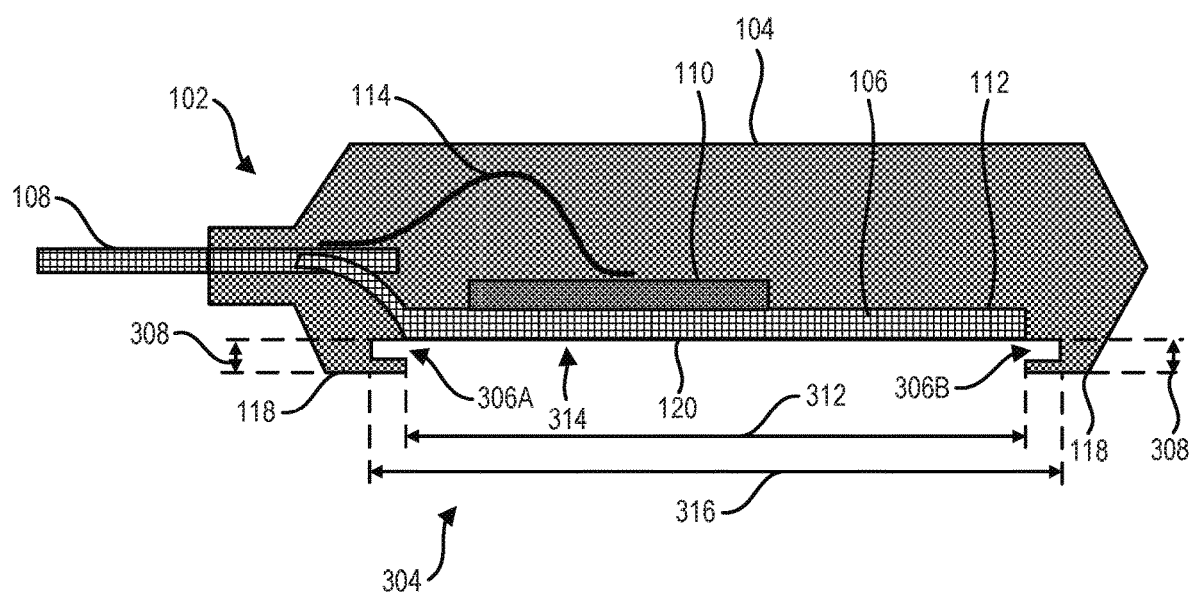

FIGS. 3A-3B illustrate an embodiment of a cross-sectional view of an integrated circuit package respectively at 300A and 300B. Integrated circuit package 300B is the same as integrated circuit package 300A but does not include the isolation layer 302. In other embodiments, integrated circuit packages 300A and 300B can be any suitable type of package as described herein. In the illustrated embodiment, isolation layer 302 fills cavity 304 and the undercuts 306A and 306B such that all angles between intersecting or adjacent portions of isolation layer 302 and cavity 304 are the same. In the illustrated embodiment, isolation layer 302 is a polymer isolation layer. In various embodiments, isolation layer 302 can be formed from suitable materials that include, but are not limited to, polymer ceramic materials, cement materials and highly filled polymers, such as epoxies, silicones or rubbers, that are filled with silicon dioxide ($SiO_2$), aluminum oxide ($Al_2O_3$), aluminum nitride (AlN), boron nitride (BN), zinc oxide (ZnO) and/or magnesium oxide (MgO). In the illustrated embodiment, isolation layer 302 has a thickness that is within a range of approximately 100 microns to 500 microns in a direction that is perpendicular to a plane of the bottom surface 118 of mold compound 104. In other embodiments, isolation layer 302 has a thickness that is either less than 100 microns or greater than 500 microns.

In the embodiments illustrated in FIG. 1 and FIG. 2, the undercut distances 210A and 210B were less than the distance 212 between the bottom surface 120 of die pad 106 and the bottom surface 118 of mold compound 104. In the embodiment illustrated in FIG. 3A and FIG. 3B, the undercuts 306A and 306B are spaced at a distance 308 above the bottom surface 118 of the mold compound 104 that is equal to or approximately equal to a distance, also illustrated at 308, between the bottom surface 120 of the die pad 106 and the bottom surface 118 of the mold compound 104. Isolation layer 302 includes protrusions 310A and 310B that are within or fill respective undercuts 306A and 306B. As such, isolation layer 302 has a width 312 at opening 314 of cavity 304 that is less than a width 316 of isolation layer 302 at distance 308. The difference between width 312 and width 316 mechanically locks or retains isolation layer 302 within cavity 116 in reference to a direction that is perpendicular to a plane of the bottom surface 118 of mold compound 104.

FIG. 4 illustrates an embodiment of a perspective view of an integrated circuit package at 400. Integrated circuit package 400 illustrates a bottom view of integrated circuit package 100 without heatsink 126, and/or a bottom view of integrated circuit package 300A. In another embodiment, integrated circuit package 400 illustrates a top view of integrated circuit package 100 and/or a top view of integrated circuit package 300A.

In the illustrated embodiment, integrated circuit package 400 includes a mold compound illustrated at 402. Mold compound 402 is a polymer mold compound or an epoxy mold compound. A thermally conductive and electrically insulating isolation layer 408 has a bottom surface that is exposed through a bottom surface 406 of mold compound 402. In the illustrated embodiment, isolation layer 408 is a polymer isolation layer. In various embodiments, isolation layer 408 can be formed from suitable materials that include, but are not limited to, polymer ceramic materials, cement materials and highly filled polymers, such as epoxies, silicones or rubbers, that are filled with silicon dioxide ($SiO_2$), aluminum oxide ($Al_2O_3$), aluminum nitride (AlN), boron nitride (BN), zinc oxide (ZnO) and/or magnesium oxide (MgO). In the illustrated embodiment, isolation layer 408 has a thickness that is within a range of approximately 100 microns to 500 microns in a direction that is perpendicular to a plane of the bottom surface 406 of mold compound 402. In other embodiments, isolation layer 408 has a thickness that is either less than 100 microns or greater than 500 microns. The distance illustrated at 410 corresponds with distance 206 illustrated in FIG. 2 and/or distance 312 illustrated in FIG. 3B. In the embodiment illustrated in FIG. 4, the bottom surface of isolation layer 408 has a rectangular shape and distance 412 is in a direction that is transverse to distance 410. An area of the bottom surface of isolation layer 408 is equal to a product of distance 410 and distance 412.

In one embodiment, isolation layer 408 has protrusions on all four sides of the rectangular shape illustrated in FIG. 4. Referring also to FIGS. 1-3B, an opening 202 or 314 of respective cavity 116 or 304 at the bottom surface 118 of mold compound 104 has an area equal to a product of distance 410 and distance 412. Referring also to FIGS. 1-3B, an area of the undercuts (e.g., 204A, 204B or 306A, 306B) corresponding to the protrusions on the four sides has an area determined as a product of the distances in the direction of distance 410 and distance 412 measured at a distance of the undercuts above the bottom surface 118 of mold compound 104. The opening 202 or 314 of respective cavity 116 or 304 at the bottom surface 118 of mold compound 104 has the area that is less than the area of the respective undercuts (e.g., 204A, 204B or 306A, 306B) at the distance of the undercuts above the bottom surface 118 of mold compound 104.

Figure 5:
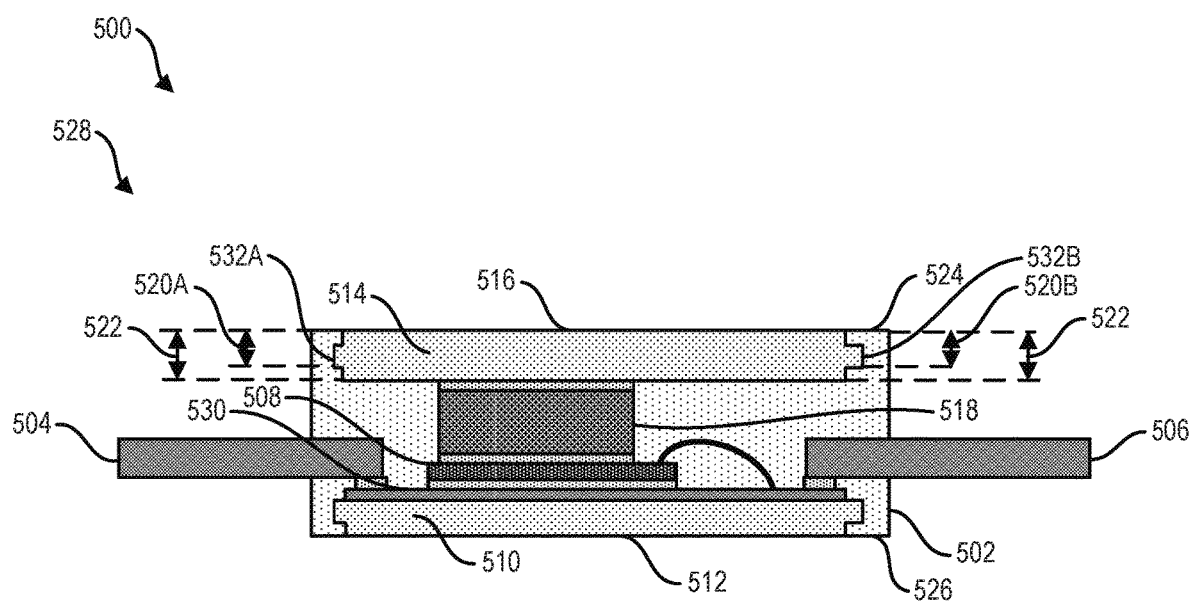
FIG. 5 illustrates an embodiment of a cross-sectional view of an integrated circuit package.

FIG. 5 illustrates an embodiment of a cross-sectional view of an integrated circuit package at 500. Integrated circuit package 500 is a Double Sided Cooling (DSC) package that includes a bottom thermally conductive and electrically insulating isolation layer 510 and a top thermally conductive and electrically insulating isolation layer 514. In the illustrated embodiment, bottom isolation layer 510 and top isolation layer 514 are polymer isolation layers. In various embodiments, bottom isolation layer 510 and top isolation layer 514 can be formed from suitable materials that include, but are not limited to, polymer ceramic materials, cement materials and highly filled polymers, such as epoxies, silicones or rubbers, that are filled with silicon dioxide ($SiO_2$), aluminum oxide ($Al_2O_3$), aluminum nitride (AlN), boron nitride (BN), zinc oxide (ZnO) and/or magnesium oxide (MgO). In the illustrated embodiment, bottom isolation layer 510 and top isolation layer 514 have a thickness that is within a range of approximately 100 microns to 500 microns in a direction that is perpendicular to a plane of the respective bottom surface 526 and top surface 524 of mold compound 502. In other embodiments, bottom isolation layer 510 and top isolation layer 514 have a thickness that is either less than 100 microns or greater than 500 microns. Bottom isolation layer 510 has a bottom surface 512 that is open or exposed at a bottom surface 526 of mold compound 502, and top isolation layer 514 has a top surface 516 that is open or exposed at a top surface 524 of mold compound 502. A semiconductor die 508 is attached to a top surface of a die pad 530 of leadframe 528. Leadframe 528 includes leads 504 and 506. Bottom isolation layer 510 is locked within a bottom cavity (not illustrated) at the bottom surface 526 of mold compound 502 and contacts the bottom surface of die pad 530. Embodiments of bottom isolation layer 510 and the bottom cavity are described in FIGS. 1-4 with respect to bottom isolation layers 122 and 302 and with respect to bottom cavities 116 and 304. In the illustrated embodiment, leadframe 528 is a copper (Cu) leadframe. In other embodiments, leadframe 528 can be formed from other suitable materials that include, but are not limited to, aluminum (Al), nickel (Ni), iron (Fe) and steel.

The embodiment described in FIG. 5 relates to a top side cooling approach which can be incorporated into any suitable type of package that includes, but is not limited to, a TO package, a QFN package, an SO package, a SOT package, a TSOP package and a DSO package. In the illustrated embodiment, mold compound 502 is a polymer mold compound or an epoxy mold compound. In other embodiments, mold compound 502 can be formed from other suitable materials.

In the illustrated embodiment, top isolation layer 514 fills a top cavity (not illustrated) and etched top undercuts of the top cavity to lock the isolation layer 514 to the mold compound 502. The top cavity is open at the top surface 524 of mold compound 502 and is over semiconductor die 508 in a direction that is perpendicular with a plane of top surface 524 of mold compound 502. Top isolation layer 514 fills the top cavity such that all angles between intersecting or adjacent portions of top isolation layer 514 and the top cavity are the same. As such, the dimensions of top isolation layer 514 illustrated in FIG. 5 are the same as the dimensions of the top cavity. Top isolation layer 514 includes protrusions 532A and 532B that are within or fill corresponding undercuts within the top cavity to lock the isolation layer 514 to the mold compound 502. Although two protrusions 532A and 532B are illustrated in FIG. 5, in other embodiments, top isolation layer 514 can have one protrusion or three or more protrusions. Although the two protrusions 532A and 532B are illustrated as rectangular in shape, in other embodiment, the two protrusions 532A and 532B can have other suitable shapes.

In the illustrated embodiment, a thermally conductive spacer 518 is over the semiconductor die 508 and is in thermally conductive contact with a top surface of the semiconductor die 508. The top cavity exposes a top surface of spacer 518 such that the top isolation layer 514 contacts the top surface of spacer 518. In various embodiments, spacer 518 can be made from any suitable material that includes, but is not limited to, copper (Cu).

In the illustrated embodiment, depth 520A is equal to depth 520B. Depth 520A and depth 520B are less than a distance illustrated at 522 between the top surface 524 of mold compound 502 and a top surface of spacer 518. In other embodiments, depth 520A is not equal to depth 520B. In other embodiments, depths 520A and 520B are both equal to distance 522. Embodiments of top isolation layer 514 and the top cavity are described with respect to FIGS. 1-4 where rather than contacting a bottom surface 120 of die pad 106, bottom isolation layers 122 and 302 contact a top surface of spacer 518.

FIGS. 6A-6B illustrate embodiments of a top perspective view and a bottom view of an integrated circuit package. FIG. 6A illustrates a perspective view at 600A and FIG. 6B illustrates a bottom view at 600B. Integrated circuit package 600 represents an embodiment of integrated circuit package 500 and is a Double Sided Cooling (DSC) package. Integrated circuit package 600A/600B includes a mold compound 602 and leads 604 and 606. In the illustrated embodiment, mold compound 602 is a polymer mold compound or an epoxy mold compound. A thermally conductive and electrically insulating top isolation layer 608 is exposed through a top surface 610 of mold compound 602, and a thermally conductive and electrically insulating bottom isolation layer 612 is exposed through a bottom surface 614 of mold compound 602. In the illustrated embodiment, top isolation layer 608 and bottom isolation layer 612 are polymer isolation layers. In various embodiments, top isolation layer 608 and bottom isolation layer 612 can be formed from suitable materials that include, but are not limited to, polymer ceramic materials, cement materials and highly filled polymers, such as epoxies, silicones or rubbers, that are filled with silicon dioxide ($SiO_2$), aluminum oxide ($Al_2O_3$), aluminum nitride (AlN), boron nitride (BN), zinc oxide (ZnO) and/or magnesium oxide (MgO). In the illustrated embodiment, top isolation layer 608 and bottom isolation layer 612 have a thickness that is within a range of approximately 100 microns to 500 microns in a direction that is perpendicular to a plane of the respective top surface 610 and bottom surface 614 of mold compound 602. In other embodiments, top isolation layer 608 and bottom isolation layer 612 have a thickness that is either less than 100 microns or greater than 500 microns.

Figure 7:
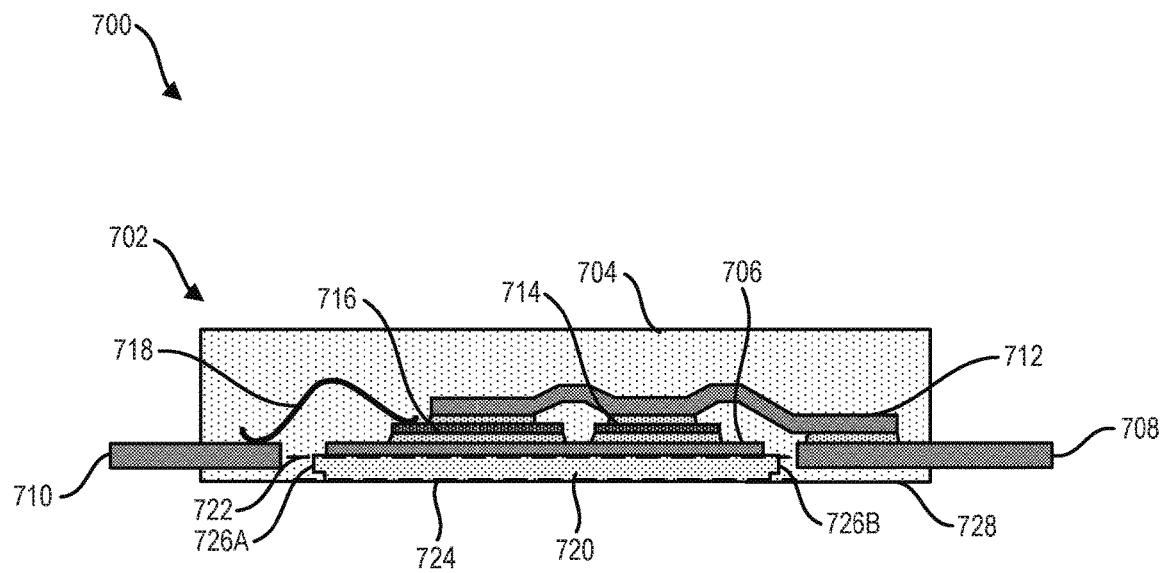
FIG. 7 illustrates an embodiment of a cross-sectional view of a leadframe module.

FIG. 7 illustrates an embodiment of a cross-sectional view of a leadframe module at 700. Leadframe module 700 includes a leadframe 702 that includes a die pad 706. A first semiconductor die 714 is attached to a top surface of die pad 706, and a second semiconductor die 716 is attached to the top surface of die pad 706. In the illustrated embodiment, first semiconductor die 714 is a first power semiconductor die and second semiconductor die 716 is a second power semiconductor die. First semiconductor die 714 and second semiconductor die 716 are attached to leads 708 via a clip 712, and second semiconductor die 716 is attached to leads 710 via wire bonds 718. A mold compound 704 encapsulates the first semiconductor die 714, the second semiconductor die 716, and at least a portion of leadframe 702.

In the illustrated embodiment, a thermally conductive and electrically insulating isolation layer 720 includes protrusions 726A and 726B. In the illustrated embodiment, isolation layer 720 is a polymer isolation layer. In various embodiments, isolation layer 720 can be formed from suitable materials that include, but are not limited to, polymer ceramic materials, cement materials and highly filled polymers, such as epoxies, silicones or rubbers, that are filled with silicon dioxide ($SiO_2$), aluminum oxide ($Al_2O_3$), aluminum nitride (AlN), boron nitride (BN), zinc oxide (ZnO) and/or magnesium oxide (MgO). In the illustrated embodiment, isolation layer 720 has a thickness that is within a range of approximately 100 microns to 500 microns in a direction that is perpendicular to a plane of the bottom surface 728 of mold compound 704. In other embodiments, isolation layer 720 has a thickness that is either less than 100 microns or greater than 500 microns. Isolation layer 720 contacts a bottom surface of die pad 706 and is locked within the mold compound 728 via the protrusions 726A and 726B (see also, FIGS. 1-4 and FIGS. 13A-13C). Dashed line 722 represents a bottom surface of die pad 706, and dashed line 724 represents bottom surface 728 of mold compound 704. The protrusions 726A and 726B are spaced at a distance above the bottom surface 728 of mold compound 704, where the distance is between dash line 722 and dash line 724 in a direction that is perpendicular with a plane of the bottom surface 728 of mold compound 704. In this embodiment, the distance of the cavity undercuts corresponding to protrusions 726A and 726B are approximately equal to a distance between the bottom surface of the die pad 706 and the bottom surface 728 of mold compound 704 (see also, FIGS. 1-4 and FIGS. 13A-13C). Embodiments of isolation layer 720 and the cavity are described with respect to FIGS. 1-4 and FIGS. 13A-13C.

In the embodiment illustrated in FIG. 7, a lower surface (illustrated at 724) of the isolation layer 720 is approximately coplanar with the bottom surface 728 of mold compound 704. In other embodiments, the lower surface of the isolation layer 720 is below the bottom surface 728 of mold compound 704 (see also, FIG. 8). Although two protrusions 726A and 726B are illustrated in FIG. 7, in other embodiments, isolation layer 720 can have one protrusion or three or more protrusions. In the illustrated embodiment, mold compound 704 is a polymer mold compound or an epoxy mold compound, and leadframe 702 and clip 712 are made of copper (Cu). In other embodiments, leadframe 702 and clip 712 can be formed from other suitable materials that include, but are not limited to, aluminum (Al), nickel (Ni), iron (Fe) and steel.

Figure 8:
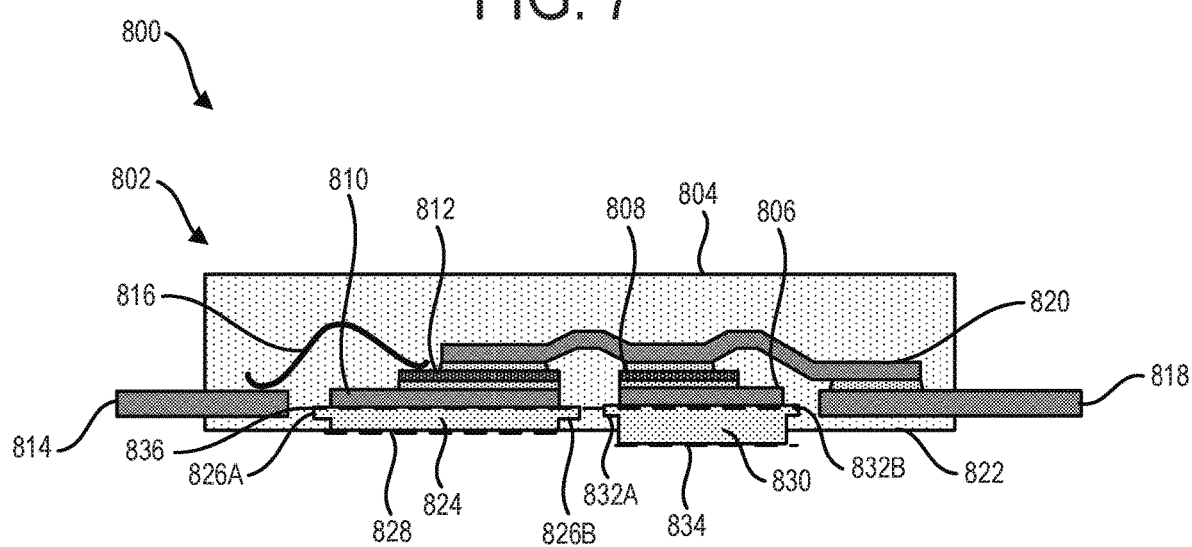
FIG. 8 illustrates an embodiment of a cross-sectional view of a leadframe module.

FIG. 8 illustrates an embodiment of a cross-sectional view of a leadframe module at 800. Leadframe module 800 includes a leadframe 802 with a die pad 806 and a die pad 810. A first semiconductor die 808 is attached to a top surface of die pad 806, and a second semiconductor die 812 is attached to a top surface of die pad 810. In the illustrated embodiment, first semiconductor die 808 is a first power semiconductor die and second semiconductor die 812 is a second power semiconductor die. First semiconductor die 808 and second semiconductor die 812 are attached to leads 818 via a clip 820, and second semiconductor die 812 is attached to leads 814 via wire bonds 816. A mold compound 804 encapsulates the first semiconductor die 808, the second semiconductor die 812, and at least a portion of leadframe 802.

In the illustrated embodiment, a thermally conductive and electrically insulating first isolation layer 830 includes protrusions 832A and 832B and a thermally conductive and electrically insulating second isolation layer 824 includes protrusions 826A and 826B. First isolation layer 830 contacts a bottom surface of die pad 806 and is locked within the mold compound 804 via the protrusions 832A and 832B (see also, FIGS. 1-4 and FIGS. 13A-13C). Second isolation layer 824 contacts a bottom surface of die pad 810 and is locked within the mold compound 804 via the protrusions 826A and 826B (see also, FIGS. 1-4 and FIGS. 13A-13C). In the illustrated embodiment, first isolation layer 830 and second isolation layer 824 are polymer isolation layers. In various embodiments, first isolation layer 830 and second isolation layer 824 can be formed from suitable materials that include, but are not limited to, polymer ceramic materials, cement materials and highly filled polymers, such as epoxies, silicones or rubbers, that are filled with silicon dioxide ($SiO_2$), aluminum oxide ($Al_2O_3$), aluminum nitride (AlN), boron nitride (BN), zinc oxide (ZnO) and/or magnesium oxide (MgO). In the illustrated embodiment, first isolation layer 830 and second isolation layer 824 have a thickness that is within a range of approximately 100 microns to 500 microns in a direction that is perpendicular to a plane of the bottom surface 822 of mold compound 804. In other embodiments, first isolation layer 830 and second isolation layer 824 have a thickness that is either less than 100 microns or greater than 500 microns. Dashed line 836 represents a bottom surface of die pad 806, and dashed line 834 represents bottom surface of first isolation layer 830. The protrusions 832A and 832B are spaced at a distance above the bottom surface 822 of mold compound 804, where the distance between dash line 836 and the bottom surface 822 of mold compound 804 is in a direction that is perpendicular to a plane of the bottom surface 822 of mold compound 804. In this embodiment, the distance of first cavity undercuts corresponding to protrusions 832A and 832B are approximately equal to a distance between the bottom surface of the die pad 806 and the bottom surface 822 of mold compound 804 (see also, FIGS. 1-4 and FIGS. 13A-13C). Embodiments of first isolation layer 830 and the first cavity are described with respect to FIGS. 1-4 and FIGS. 13A-13C.

In the embodiment illustrated in FIG. 8, a lower surface (illustrated at 834) of the isolation layer 830 is below the bottom surface 822 of mold compound 804. In another embodiment, the lower surface of the first isolation layer 830 is approximately coplanar with the bottom surface 822 of mold compound 804. Although two protrusions 832A and 832B are illustrated in FIG. 8, in other embodiments, first isolation layer 830 can have one protrusion or three or more protrusions.

In the illustrated embodiment, the dashed line 836 represents a bottom surface of die pad 810 and dashed line 828 represents the bottom surface 822 of mold compound 804. The protrusions 826A and 826B are spaced at a distance above the bottom surface 822 of mold compound 804, where the distance is between dash line 836 and dash line 828 in a direction that is perpendicular to a plane of the bottom surface 822 of mold compound 804. In this embodiment, the distance of the protrusions 826A and 826B are approximately equal to a distance between the bottom surface of the die pad 810 and the bottom surface 822 of mold compound 804. Embodiments of second isolation layer 824 and the second cavity are described with respect to FIGS. 1-4 and with respect to bottom isolation layers 122 and 302 and bottom cavities 116 and 304.

In the embodiment illustrated in FIG. 8, a lower surface (illustrated at 828) of the second isolation layer 824 is approximately coplanar with the bottom surface 822 of mold compound 804. In other embodiments, the lower surface of the second isolation layer 824 is below the bottom surface 822 of mold compound 804. Although two protrusions 826A and 826B are illustrated in FIG. 8, in other embodiments, second isolation layer 824 can have one protrusion or three or more protrusions. In the illustrated embodiment, mold compound 804 is a polymer mold compound or an epoxy mold compound, and leadframe 802 and clip 820 are made of copper (Cu). In other embodiments, leadframe 802 and clip 820 can be formed from other suitable materials that include, but are not limited to, aluminum (Al), nickel (Ni), iron (Fe) and steel.

Figure 9A:
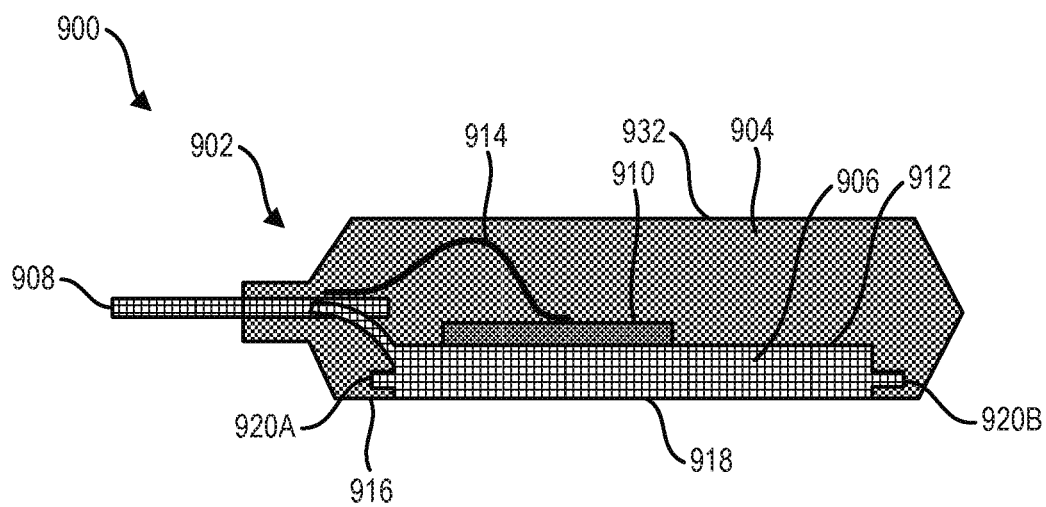
FIGS. 9A-9C illustrate an embodiment of a method of forming an integrated circuit package.
Figure 9B:
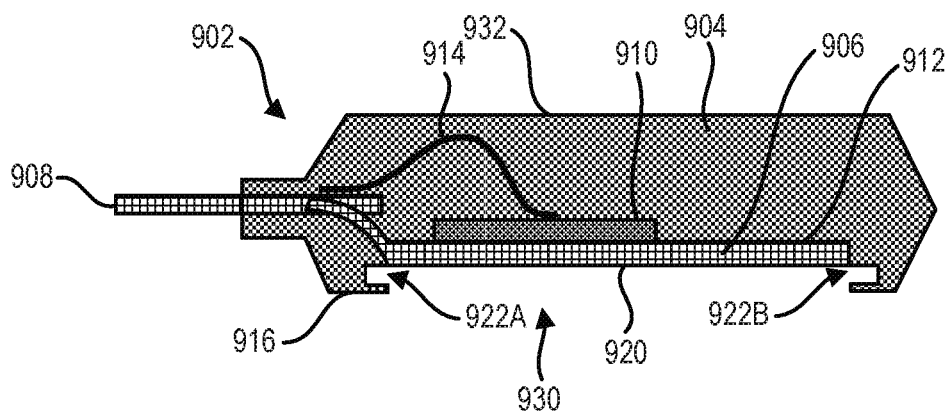
Figure 9C:
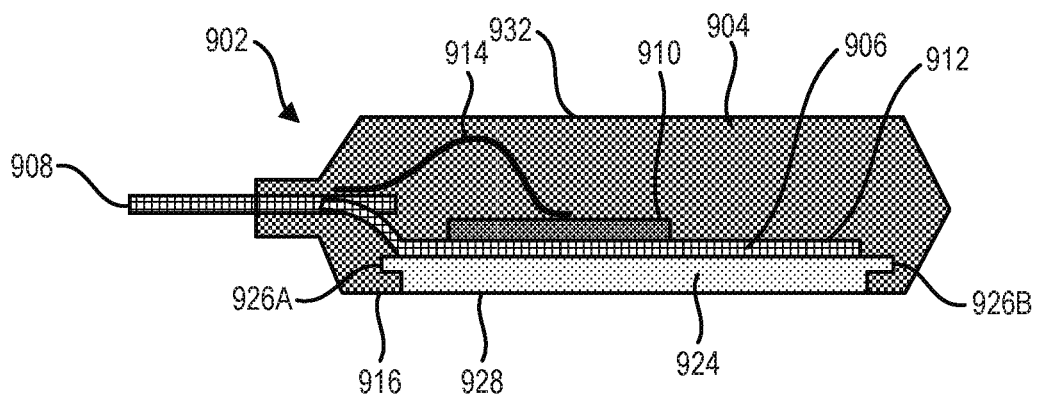

FIGS. 9A-9C illustrate an embodiment of a method of forming an integrated circuit package at 900. Although the embodiments described in FIGS. 9A-9C relate to a TO package, integrated circuit package 900 can be any other suitable type of package that includes, but is not limited to, a QFN package, an SO package, a SOT package, a TSOP package, a DSO package, a DSC package and a leadframe module. FIG. 9A illustrates a leadframe 902 that includes a die pad 906 and a semiconductor die 910 attached to a top surface 912 of die pad 906. In the illustrated embodiment, leadframe 906 is a copper (Cu) leadframe. In other embodiments, leadframe 902 can be formed from other suitable materials that include, but are not limited to, aluminum (Al), nickel (Ni), iron (Fe) and steel. Semiconductor die 910 is attached to leads 908 via wire bonds 914. A mold compound 904 encapsulates the semiconductor die 910 and a portion of the die pad 906. In the illustrated embodiment, mold compound 904 is a polymer mold compound or an epoxy mold compound. The die pad 906 includes a bottom surface 918 exposed at a bottom surface 916 of the mold compound 904. Die pad 906 includes a protruding part 920A and a protruding part 920B. A protruding part 920A extends away from a left side surface of die pad 906 in a transverse direction from the left side surface, and protruding part 920B extends away from a right side surface of die pad 906 in a transverse direction from the right side surface. Protruding part 920A and protruding part 920B are below the top surface 912 of die pad 906 and are above the bottom surface 916 of mold compound 904.

FIG. 9B illustrates an embodiment of forming a cavity 930 within the bottom surface 916 of mold compound 904 by etching the bottom surface 918 of die pad 906 to a distance above the bottom surface 916 of mold compound 904. At least a portion of protruding part 920A and protruding part 920B of die pad 906 are etched as illustrated by undercuts 922A and 922B. After etching, a bottom surface of the die pad 906 is exposed as illustrated at 920. Etching the bottom surface 918 of die pad 906 includes using an etchants such as copper chloride, iron chloride, HF, NaOH, HNO$_3$, K$_3$Fe(CN)$_6$, KI and any combination or derivative of these etchants. In other embodiments, other etchants can be used. In other embodiments, any suitable isotropic etchant or anisotropic etchant can be used.

FIG. 9C illustrates an embodiment of filling cavity 930 with a thermally conductive and electrically insulating isolation layer 924. In the illustrated embodiment, isolation layer 924 is a polymer isolation layer. In various embodiments, isolation layer 924 can be formed from suitable materials that include, but are not limited to, polymer ceramic materials, cement materials and highly filled polymers, such as epoxies, silicones or rubbers, that are filled with silicon dioxide ($SiO_2$), aluminum oxide ($Al_2O_3$), aluminum nitride (AlN), boron nitride (BN), zinc oxide (ZnO) and/or magnesium oxide (MgO). In the illustrated embodiment, isolation layer 924 has a thickness that is within a range of approximately 100 microns to 500 microns in a direction that is perpendicular to a plane of the bottom surface 916 of mold compound 904. In other embodiments, isolation layer 924 has a thickness that is either less than 100 microns or greater than 500 microns. Filling cavity 930 with isolation layer 924 includes filling cavity 930 with isolation layer 924 such that all angles between intersecting or adjacent portions of isolation layer 924 and cavity 930 are the same. Isolation layer 924 includes protrusions 926A and 926B that are within or fill respective undercuts 922A and 922B. The distance of the undercuts 922A and 922B corresponding to respective protrusions 926A and 926B are approximately equal to a distance between the bottom surface 920 of the die pad 906 and the bottom surface 916 of mold compound 904. Filling cavity 930 with isolation layer 924 includes filling cavity 930 with isolation layer 924 such that a lower surface 928 of the isolation layer 924 is approximately coplanar with the bottom surface 916 of mold compound 904. In other embodiments, filling cavity 930 with isolation layer 924 includes filling cavity 930 with isolation layer 924 such that the lower surface 928 of isolation layer 924 is either below or above the bottom surface 916 of mold compound 904 in a direction that is perpendicular to a plane of the bottom surface 916 of mold compound 904. In one embodiment, filling cavity 930 with isolation layer 924 includes filling cavity 930 with isolation layer 924 using an inkjet process. In other embodiments, filling cavity 930 with isolation layer 924 includes filling cavity 930 with isolation layer 924 using a molding process, a spray process or a dip process.

In another embodiment, integrated circuit package 900 includes a thermally conductive spacer that is over semiconductor die 910 and in thermally conductive contact with a top surface of the semiconductor die 910 (See also, FIG. 5). The spacer can be made from any suitable material that includes, but is not limited to, copper (Cu). The spacer is encapsulated by the mold compound 904 and includes a top surface exposed at a top surface 932 of mold compound 904. The spacer includes protruding parts that are similar to protruding parts 920A and 920B of die pad 906. One protruding part of the spacer extends away from a left side surface of the spacer in a transverse direction from the left side surface, and another protruding part extends away from a right side surface of the spacer in a transverse direction from the right side surface. Both protruding parts are below the top surface of the spacer and are above the top surface of semiconductor die 910. The method includes forming a top cavity within the top surface 932 of mold compound 904 by etching the top surface of the spacer to a depth below the top surface 932 of mold compound 904 and further includes etching at least a portion of the protruding parts to form undercuts similar to undercuts 922A and 922B. Etching the top surface of the spacer includes using an etchants such as copper chloride, iron chloride, HF, NaOH, $HNO_3$, $K_3Fe(CN)_6$, KI and any combination or derivative of these etchants. In other embodiments, other etchants can be used. Referring also to FIG. 5, the method includes filling the top cavity within the top surface 932 of mold compound 904 with a top thermally conductive and electrically insulating isolation layer 514. In the illustrated embodiment, top isolation layer 514 is a polymer isolation layer. In various embodiments, top isolation layer 514 can be formed from suitable materials that include, but are not limited to, polymer ceramic materials, cement materials and highly filled polymers, such as epoxies, silicones or rubbers, that are filled with silicon dioxide ($SiO_2$), aluminum oxide ($Al_2O_3$), aluminum nitride (AlN), boron nitride (BN), zinc oxide (ZnO) and/or magnesium oxide (MgO). In the illustrated embodiment, top isolation layer 514 has a thickness that is within a range of approximately 100 microns to 500 microns in a direction that is perpendicular to a plane of the top surface 932/524 of mold compound 904/502. In other embodiments, top isolation layer 514 has a thickness that is either less than 100 microns or greater than 500 microns. Filling the top cavity with top isolation layer 514 includes filling the cavity with top isolation layer 514 such that all angles between intersecting or adjacent portions of top isolation layer 514 and the cavity are the same. Top isolation layer 514 includes protrusions 532A and 532B that are within or fill the respective undercuts. Referring to FIG. 5, the depth of the undercuts and corresponding protrusions 532A and 532B are below the top surface 932/524 of mold compound 904/502 and at or above a top surface of the spacer 518. Filling the top cavity with top isolation layer 514 includes filling the top cavity with isolation layer 524 such that an upper surface 516 of the isolation layer 514 is approximately coplanar with the top surface 932/524 of mold compound 904/502. In other embodiments, filling the top cavity with top isolation layer 514 includes filling the top cavity with top isolation layer 514 such that the upper surface 516 of top isolation layer 514 is either below or above the top surface 932/524 of mold compound 904/502 in a direction that is perpendicular to a plane of the top surface 932/524 of mold compound 904/502. In one embodiment, filling the top cavity with top isolation layer 514 includes filling the top cavity with top isolation layer 514 using an inkjet process. In other embodiments, filling the top cavity with isolation layer 514 includes filling the top cavity with isolation layer 514 using a molding process, a spray process or a dip process.

Figure 10A:
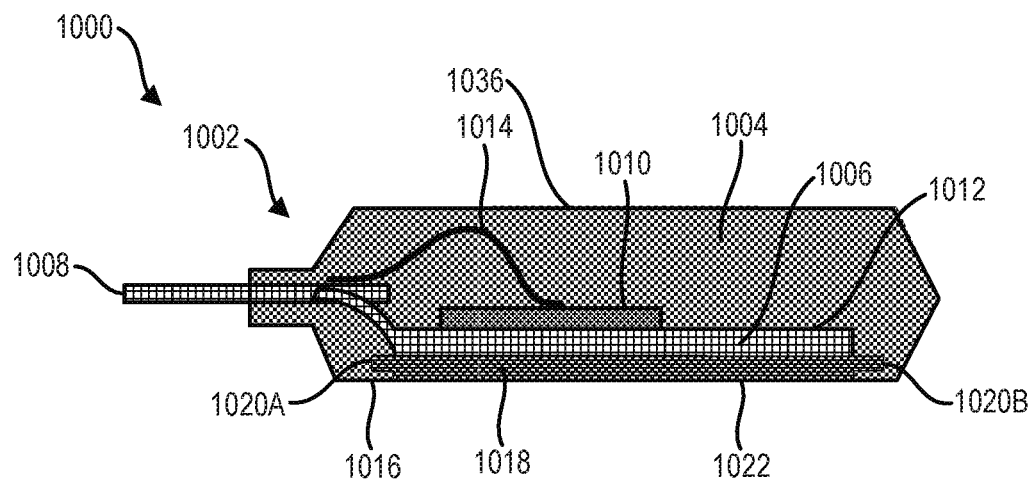
FIGS. 10A-10C illustrate an embodiment of a method of forming an integrated circuit package.
Figure 10B:
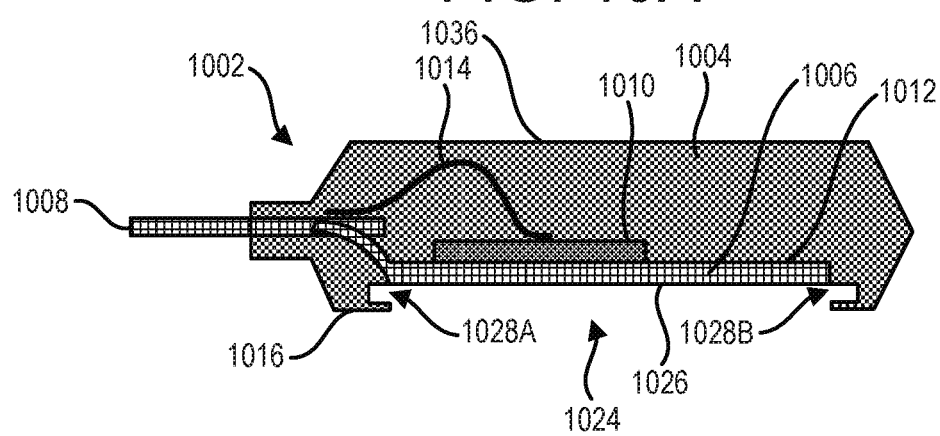
Figure 10C:
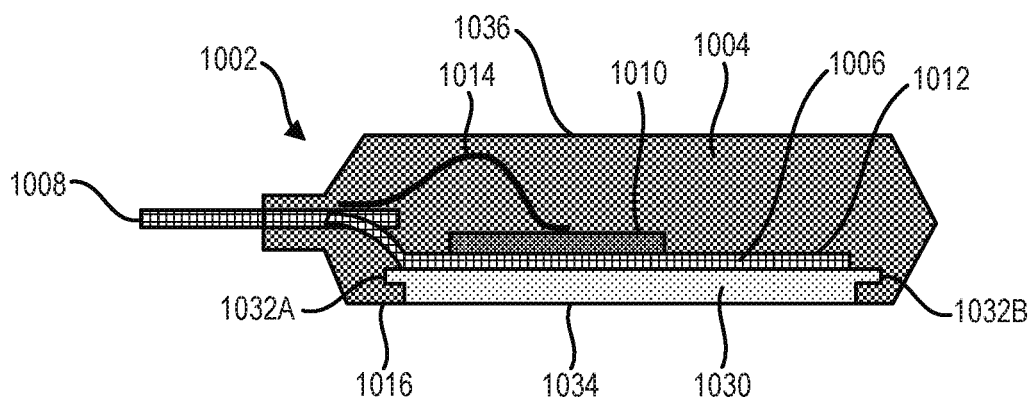

FIGS. 10A-10C illustrate an embodiment of a method of forming an integrated circuit package at 1000. Although the embodiments described in FIGS. 10A-10C relate to a TO package, integrated circuit package 1000 can be any other suitable type of package that includes, but is not limited to, a QFN package, an SO package, a SOT package, a TSOP package, a DSO package, a DSC package and a leadframe module. FIG. 10A illustrates a leadframe 1002 that includes a die pad 1006 and a semiconductor die 1010 attached to a top surface 1012 of die pad 1006. In the illustrated embodiment, leadframe 1002 is a copper (Cu) leadframe. In other embodiments, leadframe 1002 can be formed from other suitable materials that include, but are not limited to, aluminum (Al), nickel (Ni), iron (Fe) and steel. Semiconductor die 1010 is attached to leads 1008 via wire bonds 1014. A cavity 1024 has an opening at the bottom surface 1016 of mold compound 1004 and includes one or more etched undercuts as illustrated at 1028A and 1028B. A sacrificial layer 1018 is within cavity 1024 and abuts a bottom surface 1026 of die pad 1006. The sacrificial layer 1018 includes protruding parts 1020A and 1020B that are spaced above the bottom surface 1016 of mold compound 1004. The protruding parts 1020A and 1020B are within respective undercuts 1028A and 1028B of cavity 1024. Protruding part 1020A extends away from a left side surface of sacrificial layer 1018 in a transverse direction from the left side surface, and protruding part 1020B extends away from a right side surface of sacrificial layer 1018 in a transverse direction from the right side surface. A mold compound 1004 encapsulates the semiconductor die 1010, the die pad 1006 and the sacrificial layer 1018. In the illustrated embodiment, mold compound 1004 is a polymer mold compound or an epoxy mold compound. A bottom surface 1022 of the sacrificial layer 1018 is exposed at a bottom surface 1016 of mold compound 1004.

FIG. 10B illustrates an embodiment of removing the sacrificial layer 1018 including the protruding parts 1020A and 1020B to form cavity 1024. Cavity 1024 is open at the bottom surface 1016 of mold compound 1004 and exposes a bottom surface 1026 of die pad 1006. Although two etched undercuts 1028A and 1028B are illustrated in FIG. 10B, in other embodiments, cavity 1024 can have one etched undercut or three or more etched undercuts. Although the two etched undercuts 1028A and 1028B are illustrated as rectangular in shape, in other embodiment, the etched undercuts 1028A and 1028B can have other suitable shapes. In one embodiment, the sacrificial layer 1018 comprises a water-soluble polymer, and removing the sacrificial layer 1018 includes using a water solution to dissolve the water-soluble polymer to remove the water-soluble polymer from the cavity 1024. In various embodiments, the water-soluble polymer can include suitable materials that include, but are not limited to, polyethyleneglycoles or pullulan. In one embodiment, the sacrificial layer 1018 comprises an alcohol-soluble polymer, and removing the sacrificial layer 1018 includes using an alcohol solution to dissolve the alcohol-soluble polymer to remove the alcohol-soluble polymer from the cavity 1024. In various embodiments, the alcohol-soluble polymer can include suitable materials that include, but are not limited to, polymethyl methacrylate, polyvinylpyrrolidone, nylon, or a rubber material such as butadiene rubber. In one embodiment, the sacrificial layer 1018 comprises a deformable material having a hardness that is less than the hardness of the mold compound 1004, and removing the sacrificial layer 1018 includes peeling the deformable material out of the cavity 1024. In one embodiment, the sacrificial layer 1018 comprises a polymer layer, and removing the sacrificial layer 1018 includes heating the polymer layer to a temperature at which the polymer layer transits from a crystalline state into a viscous flow state and draining the polymer out of the cavity 1024. In various embodiments, the polymer layer that transits from a crystalline state into a viscous flow state with heating can include suitable materials that include, but are not limited to, polyethylene, polycarbonate, polyamide, polystyrene and polypropylene. In one embodiment, the sacrificial layer 1018 comprises aluminum (Al) and the leadframe comprises copper (Cu), and removing the sacrificial layer 1018 includes removing the aluminum using a wet etching solution that is selective to removing the aluminum while suppressing removal of the copper. In one embodiment, the sacrificial layer 1018 comprises tin (Sn) and the leadframe comprises copper (Cu), and removing the sacrificial layer 1018 includes removing the tin using a wet etching solution that is selective to removing the tin while suppressing removal of the copper. In one embodiment, the sacrificial layer 1018 comprises copper oxide (CuO) and the leadframe comprises copper (Cu), and removing the sacrificial layer 1018 includes removing the copper oxide using a wet etching solution that is selective to removing the copper oxide while suppressing removal of the copper. In one embodiment, the sacrificial layer 1018 comprises nickel (Ni) and the leadframe comprises copper (Cu), and removing the sacrificial layer includes removing the nickel using a wet etching solution that is selective to removing the nickel while suppressing removal of the copper.

FIG. 10C illustrates an embodiment of filling cavity 1024 with a thermally conductive and electrically insulating isolation layer 1030. In the illustrated embodiment, isolation layer 1030 is a polymer isolation layer. In various embodiments, isolation layer 1030 can be formed from suitable materials that include, but are not limited to, polymer ceramic materials, cement materials and highly filled polymers, such as epoxies, silicones or rubbers, that are filled with silicon dioxide ($SiO_2$), aluminum oxide ($Al_2O_3$), aluminum nitride (AlN), boron nitride (BN), zinc oxide (ZnO) and/or magnesium oxide (MgO). In the illustrated embodiment, isolation layer 1030 has a thickness that is within a range of approximately 100 microns to 500 microns in a direction that is perpendicular to a plane of the bottom surface 1016 of mold compound 1004. In other embodiments, isolation layer 1030 has a thickness that is either less than 100 microns or greater than 500 microns. Filling cavity 1024 with isolation layer 1030 includes filling cavity 1024 with isolation layer 1030 such that all angles between intersecting or adjacent portions of isolation layer 1024 and cavity 1030 are the same. Isolation layer 1030 includes protrusions 1032A and 1032B that are within or fill respective undercuts 1028A and 1028B. The distance of the undercuts 1028A and 1028B corresponding to respective protrusions 1032A and 1032B in a direction that is perpendicular to a plane of the bottom surface 1016 of mold compound 1004 is approximately equal to a distance between the bottom surface 1026 of the die pad 1006 and the bottom surface 1016 of mold compound 1004. Filling cavity 1024 with isolation layer 1030 includes filling cavity 1024 with isolation layer 1030 such that a lower surface 1034 of the isolation layer 1030 is approximately coplanar with the bottom surface 1016 of mold compound 1004. In other embodiments, filling cavity 1024 with isolation layer 1030 includes filling cavity 1024 with isolation layer 1030 such that the lower surface 1034 of the isolation layer 1030 is either below or above the bottom surface 1016 of mold compound 1004 in a direction that is perpendicular to a plane of the bottom surface 1016 of mold compound 1004. In one embodiment, filling cavity 1024 with isolation layer 1030 includes filling cavity 1024 with isolation layer 1030 using an inkjet process. In other embodiments, filling cavity 1024 with isolation layer 1030 includes filling cavity 1024 with isolation layer 1030 using a molding process, a spray process or a dip process.

In another embodiment, integrated circuit package 1000 includes a thermally conductive spacer that is over semiconductor die 1010 and in thermally conductive contact with a top surface of the semiconductor die 1010 (See also, FIG. 5). The spacer can be made from any suitable material that includes, but is not limited to, copper (Cu). The spacer is encapsulated by the mold compound 1004 and includes a top surface that is below the top surface 1036 of the mold compound 1004. A top sacrificial layer is encapsulated by the mold compound 1004 and is over a top surface of the semiconductor die 1010. The top sacrificial layer abuts a top surface of the spacer and includes protruding parts that are similar to protruding parts 1020A and 1020B. One protruding part of the top sacrificial layer extends away from a left side surface of the top sacrificial layer in a transverse direction from the left side surface, and another protruding part of the top sacrificial layer extends away from a right side surface of the top sacrificial layer in a transverse direction from the right side surface. Both protruding parts are spaced below the top surface 1036 of the mold compound 1004.

The method includes removing the top sacrificial layer to form a top cavity that is open at the top surface 1036 of the mold compound 1004. Removing the protruding parts of the top sacrificial layer forms or exposes corresponding undercuts within the top cavity that are below the top surface 1036 of the mold compound 1004. Although two etched undercuts are described, in other embodiments, the top cavity can have one etched undercut or three or more etched undercuts. Removal of the top sacrificial layer also exposes the top surface of the spacer at a bottom surface of the top cavity. In one embodiment, the top sacrificial layer comprises a water-soluble polymer, and removing the top sacrificial layer includes using a water solution to dissolve the water-soluble polymer to remove the water-soluble polymer from the top cavity. In various embodiments, the water-soluble polymer can include suitable materials that include, but are not limited to, polyethyleneglycoles or pullulan. In one embodiment, the top sacrificial layer comprises an alcohol-soluble polymer, and removing the top sacrificial layer includes using an alcohol solution to dissolve the alcohol-soluble polymer to remove the alcohol-soluble polymer from the top cavity. In various embodiments, the alcohol-soluble polymer can include suitable materials that include, but are not limited to, polymethyl methacrylate, polyvinylpyrrolidone, nylon, or a rubber material such as butadiene rubber. In one embodiment, the top sacrificial layer comprises a deformable material having a hardness that is less than the hardness of the mold compound 1004, and removing the top sacrificial layer includes peeling the deformable material out of the top cavity. In one embodiment, the top sacrificial layer comprises a polymer layer, and removing the top sacrificial layer includes heating the polymer layer to a temperature at which the polymer layer transits from a crystalline state into a viscous flow state and draining the polymer out of the top cavity. In various embodiments, the polymer layer that transits from a crystalline state into a viscous flow state with heating can include suitable materials that include, but are not limited to, polyethylene, polycarbonate, polyamide, polystyrene and polypropylene. In one embodiment, the top sacrificial layer comprises aluminum (Al) and the spacer comprises copper (Cu), and removing the top sacrificial layer includes removing the aluminum using a wet etching solution that is selective to removing the aluminum while suppressing removal of the copper. In one embodiment, the top sacrificial layer comprises tin (Sn) and the spacer comprises copper (Cu), and removing the top sacrificial layer includes removing the tin using a wet etching solution that is selective to removing the tin while suppressing removal of the copper. In one embodiment, the top sacrificial layer comprises copper oxide (CuO) and the spacer comprises copper (Cu), and removing the top sacrificial layer includes removing the copper oxide using a wet etching solution that is selective to removing the copper oxide while suppressing removal of the copper. In one embodiment, the top sacrificial layer comprises nickel (Ni) and the spacer comprises copper (Cu), and removing the sacrificial layer includes removing the nickel using a wet etching solution that is selective to removing the nickel while suppressing removal of the copper.

Referring also to FIG. 5, the method includes filling the top cavity within the top surface 1036 of mold compound 1004 with a thermally conductive and electrically insulating top isolation layer 514. A bottom surface of the top isolation layer 514 contacts the top surface of the spacer 518. In the illustrated embodiment, top isolation layer 514 is a polymer isolation layer. In various embodiments, top isolation layer 514 can be formed from suitable materials that include, but are not limited to, polymer ceramic materials, cement materials and highly filled polymers, such as epoxies, silicones or rubbers, that are filled with silicon dioxide ($SiO_2$), aluminum oxide ($Al_2O_3$), aluminum nitride (AlN), boron nitride (BN), zinc oxide (ZnO) and/or magnesium oxide (MgO). Filling the top cavity with the top isolation layer 514 includes filling the cavity with the top isolation layer 514 such that all angles between intersecting or adjacent portions of top isolation layer 514 and the top cavity are the same. Top isolation layer 514 includes protrusions 532A and 532B that are within or fill the respective undercuts. Referring to FIG. 5, the depth of the undercuts and corresponding protrusions 532A and 532B are below the top surface 1036/524 of mold compound 1004/502 and at or above a top surface of the spacer 518. Filling the top cavity with top isolation layer 514 includes filling the top cavity with top isolation layer 514 such that an upper surface 516 of the top isolation layer 514 is approximately coplanar with the top surface 1036/524 of mold compound 1004/502. In other embodiments, filling the top cavity with top isolation layer 514 includes filling the top cavity with top isolation layer 514 such that the upper surface 516 of top isolation layer 514 is either below or above the top surface 1036/524 of mold compound 1004/502 in a direction that is perpendicular to a plane of the top surface 1036/524 of mold compound 1004/502. In one embodiment, filling the top cavity with top isolation layer 514 includes filling the top cavity with top isolation layer 514 using an inkjet process. In other embodiments, filling the top cavity with top isolation layer 514 includes filling the top cavity with top isolation layer 514 using a molding process, a spray process or a dip process.

Figure 11A:
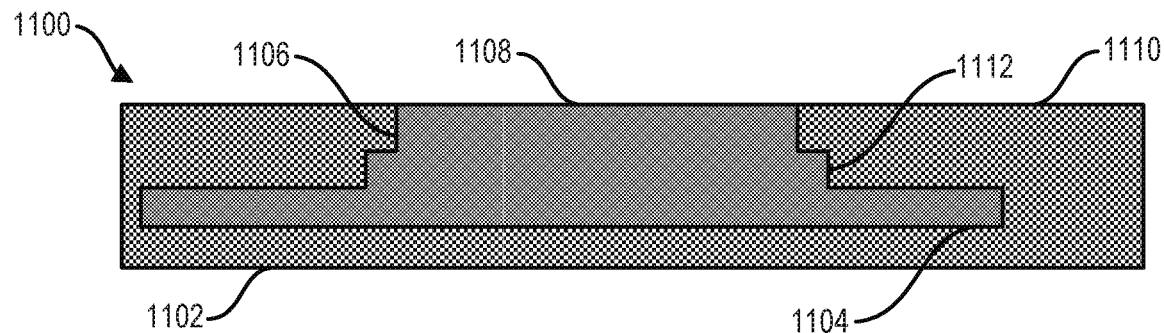
FIGS. 11A-11C illustrate an embodiment of a method of forming an integrated circuit package.
Figure 11B:
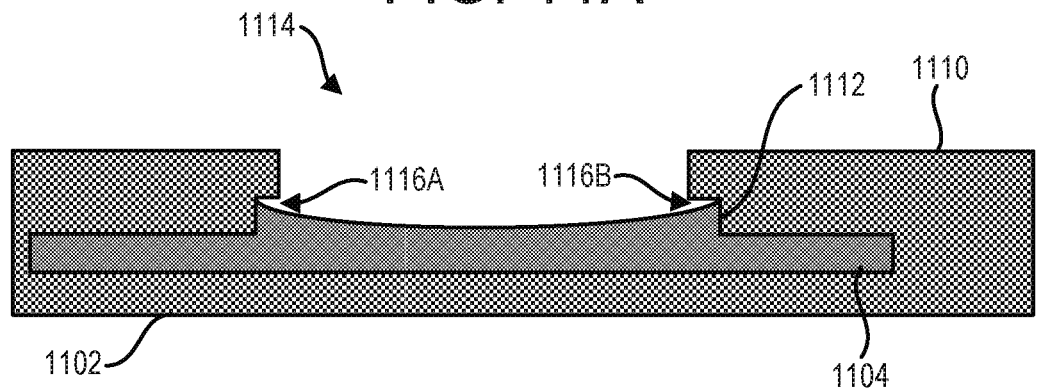
Figure 11C:
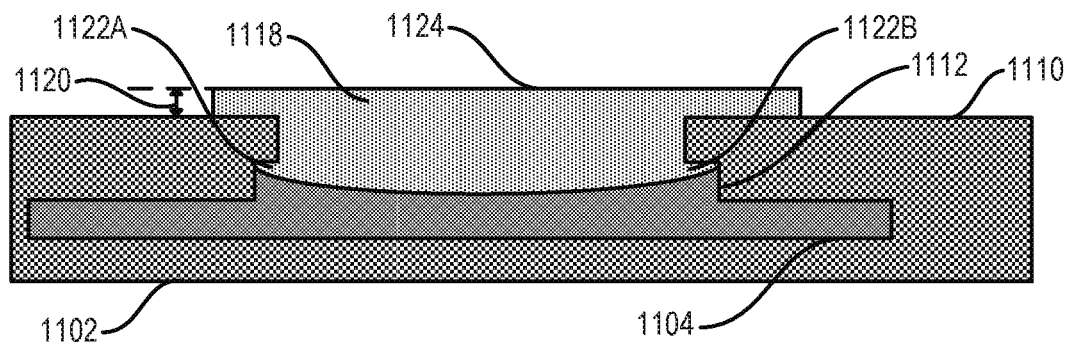

FIGS. 11A-11C illustrate an embodiment of a method of forming an integrated circuit package at 1100. The embodiments described in FIGS. 11A-11C relate to any suitable type of package that includes, but is not limited to, a TO package, a QFN package, an SO package, a SOT package, a TSOP package, a DSO package, a DSC package and a leadframe module. An embodiment of the method used to form integrated circuit package 1100 is described with respect to FIGS. 9A-9C. Referring to FIG. 11A, a leadframe 1104 is encapsulated by a mold compound 1102. In the illustrated embodiment, leadframe 1104 is a copper (Cu) leadframe. In other embodiments, leadframe 1104 can be formed from other suitable materials that include, but are not limited to, aluminum (Al), nickel (Ni), iron (Fe) and steel. Leadframe 1104 includes a stepped die pad arrangement that includes a portion at 1112 that has a larger width than a portion at 1106, where both widths are measured in a direction that is parallel to a plane of the surface 1110 of mold compound 1102. Portion 1106 has a surface 1108 that is exposed at surface 1110 of mold compound 1102.

FIG. 11B illustrates an embodiment of forming a cavity 1114 within the surface 1110 of mold compound 1102 by etching portion 1106 and etching portion 1112 to a distance below the surface 1110 of mold compound 1102. At least a part of the right and left ends or sides of portion 1112 are etched as illustrated by undercuts 1116A and 1116B. After etching, a surface of portion 1112 is exposed. Etching portion 1106 and portion 1112 includes using an etchant such as copper chloride, iron chloride, HF, NaOH, $HNO_3$, $K_3Fe(CN)_6$, KI and any combination or derivative of these etchants. In other embodiments, other etchants can be used. In other embodiments, any suitable isotropic etchant or anisotropic etchant can be used.

FIG. 11C illustrates an embodiment of filling cavity 1114 with a thermally conductive and electrically insulating isolation layer 1118. In the illustrated embodiment, isolation layer 1118 is a polymer isolation layer. In various embodiments, isolation layer 1118 can be formed from suitable materials that include, but are not limited to, polymer ceramic materials, cement materials and highly filled polymers, such as epoxies, silicones or rubbers, that are filled with silicon dioxide ($SiO_2$), aluminum oxide ($Al_2O_3$), aluminum nitride (AlN), boron nitride (BN), zinc oxide (ZnO) and/or magnesium oxide (MgO). In the illustrated embodiment, isolation layer 1118 has a thickness that is within a range of approximately 100 microns to 500 microns in a direction that is perpendicular to a plane of the surface 1110 of mold compound 1102. In other embodiments, isolation layer 1118 has a thickness that is either less than 100 microns or greater than 500 microns. Filling cavity 1114 with isolation layer 1118 includes filling cavity 1118 with isolation layer 1118 such that all angles between intersecting or adjacent portions of isolation layer 1118 and cavity 1114 are the same. Isolation layer 1118 includes protrusions 1122A and 1122B that are within or fill respective undercuts 1116A and 1116B. Filling cavity 1114 with isolation layer 1118 includes filling cavity 1114 with isolation layer 1118 such that surface 1124 of isolation layer 1118 is above surface 1110 of mold compound 1102 by a distance illustrated at 1120. In another embodiment, surface 1124 of isolation layer 1118 is approximately coplanar with surface 1110 of mold compound 1102.

Figure 12A:
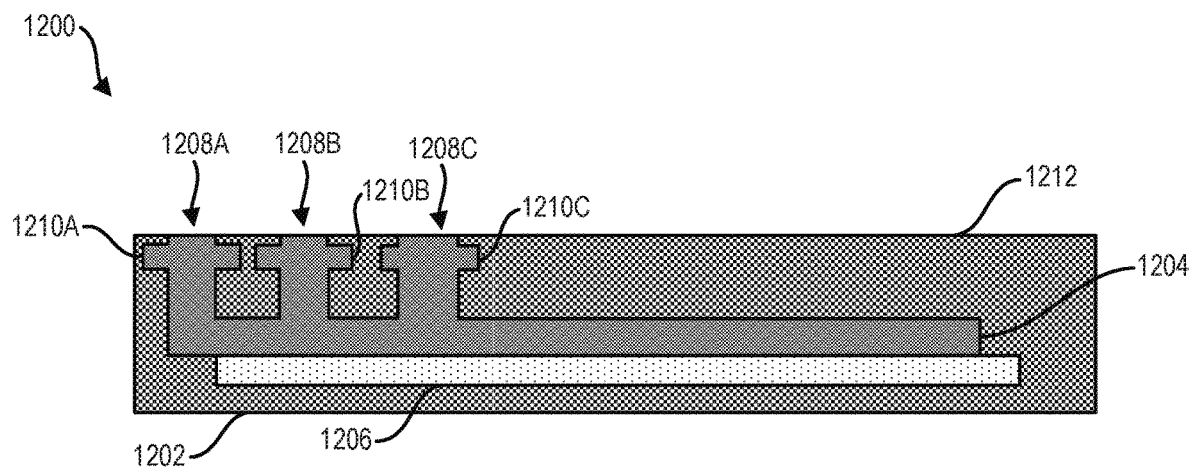
FIGS. 12A-12C illustrate an embodiment of a method of forming an integrated circuit package.
Figure 12B:
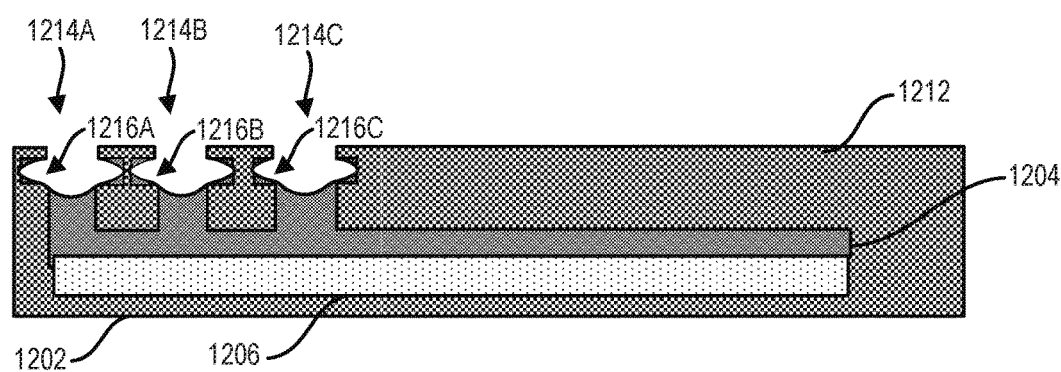
Figure 12C:
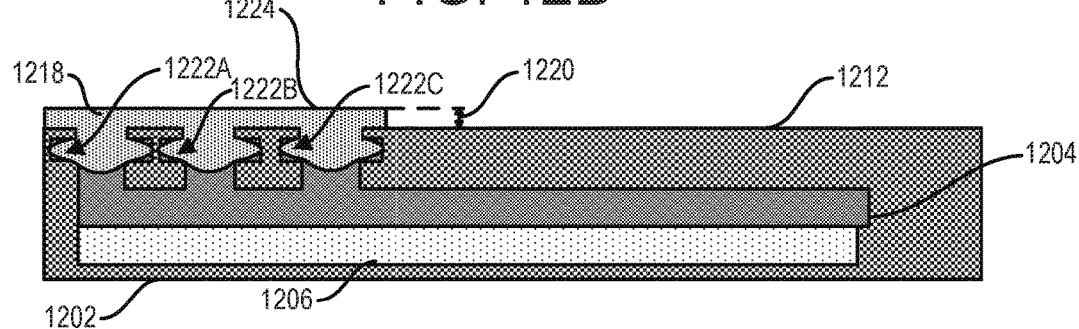

FIGS. 12A-12C illustrate an embodiment of a method of forming an integrated circuit package at 1200. The embodiments described in FIGS. 12A-12C relate to any suitable type of package that includes, but is not limited to, a TO package, a QFN package, an SO package, a SOT package, a TSOP package, a DSO package, a DSC package and a leadframe module. An embodiment of the method used to form integrated circuit package 1200 is described with respect to FIGS. 9A-9C. Referring to FIG. 12A, a leadframe 1204 is encapsulated by a mold compound 1212. In the illustrated embodiment, leadframe 1204 is a copper (Cu) leadframe. In other embodiments, leadframe 1204 can be formed from other suitable materials that include, but are not limited to, aluminum (Al), nickel (Ni), iron (Fe) and steel. A semiconductor die 1206 is attached to a first surface of the leadframe. Leadframe 1204 includes three pads illustrated at 1208A, 1208B and 1208C that extend from an opposing second surface of the leadframe 1204. The pads 1208A, 1208B and 1208C each include a surface that is exposed at surface 1212 of mold compound 1202. The pads 1208A, 1208B and 1208C also each include respective protruding parts 1210A, 1210B and 1210C that each extend away from side surfaces of respective pads 1208A, 1208B and 1208C in a direction that is transverse to the side surfaces.

FIG. 12B illustrates an embodiment of forming cavities 1214A, 1214B and 1214C within the surface 1212 of mold compound 1202 by etching the surfaces of pads 1208A, 1208B and 1208C that are exposed at surface 1212 of mold compound 1202. The surfaces of pads 1208A, 1208B and 1208C are etched to a distance below the surface 1212 of mold compound 1202. At least a portion of the right and left sides of the protruding parts 1210A, 1210B and 1210C are etched as illustrated by respective undercuts 1216A, 1216B and 1216C. Etching pads 1208A, 1208B and 1208C includes using an etchant such as copper chloride, iron chloride, HF, NaOH, $HNO_3$, $K_3Fe(CN)_6$, KI and any combination or derivative of these etchants. In other embodiments, other etchants can be used. In other embodiments, any suitable isotropic etchant or anisotropic etchant can be used.

FIG. 12C illustrates an embodiment of filling cavities 1214A, 1214B and 1214C with a thermally conductive and electrically insulating isolation layer 1218. In the illustrated embodiment, isolation layer 1218 is a polymer isolation layer. In various embodiments, isolation layer 1218 can be formed from suitable materials that include, but are not limited to, polymer ceramic materials, cement materials and highly filled polymers, such as epoxies, silicones or rubbers, that are filled with silicon dioxide ($SiO_2$), aluminum oxide ($Al_2O_3$), aluminum nitride (AlN), boron nitride (BN), zinc oxide (ZnO) and/or magnesium oxide (MgO). In the illustrated embodiment, isolation layer 1218 has a thickness that is within a range of approximately 100 microns to 500 microns in a direction that is perpendicular to a plane of the surface 1212 of mold compound 1202. In other embodiments, isolation layer 1218 has a thickness that is either less than 100 microns or greater than 500 microns. Filling cavities 1214A, 1214B and 1214C with isolation layer 1218 includes filling cavities 1214A, 1214B and 1214C with isolation layer 1218 such that all angles between intersecting or adjacent portions of isolation layer 1218 and cavities 1214A, 1214B and 1214C are the same. Isolation layer 1218 includes protrusions 1222A, 1222B and 1222C that are within or fill respective undercuts 1216A, 1216B and 1216C. Filling cavities 1214A, 1214B and 1214C with isolation layer 1218 includes filling cavities 1214A, 1214B and 1214C with isolation layer 1218 such that a surface 1224 of isolation layer 1218 is above surface 1212 of mold compound 1202 by a distance illustrated at 1220. In another embodiment, surface 1224 of isolation layer 1218 is approximately coplanar with surface 1212 of mold compound 1202.

Figure 13A:
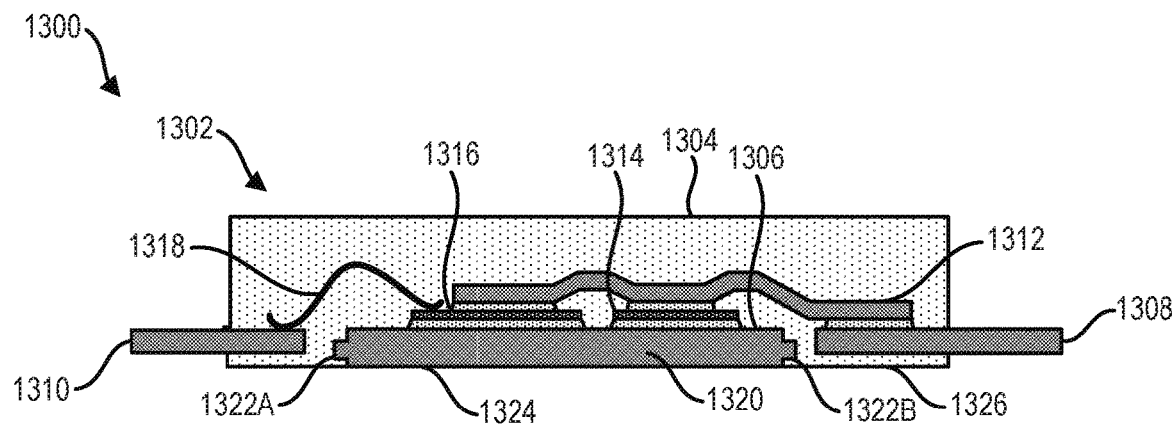
FIGS. 13A-13C illustrate an embodiment of a method of forming a leadframe module.
Figure 13B:
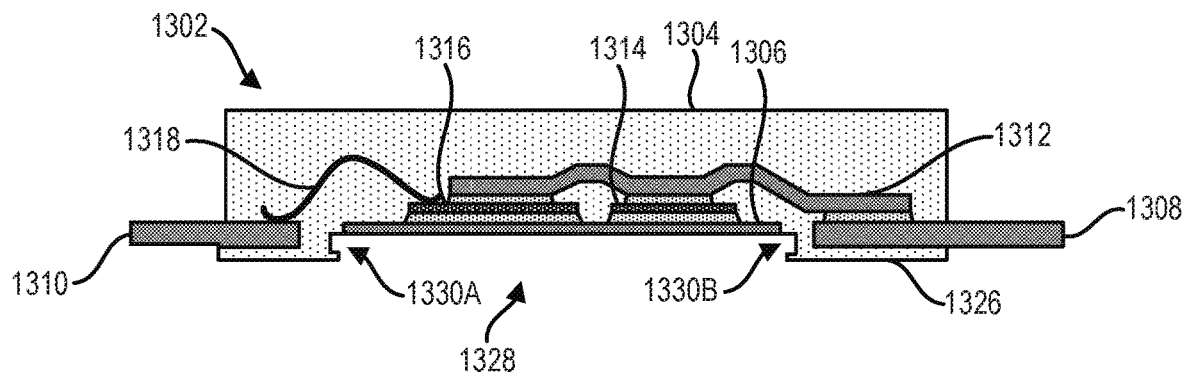
Figure 13C:
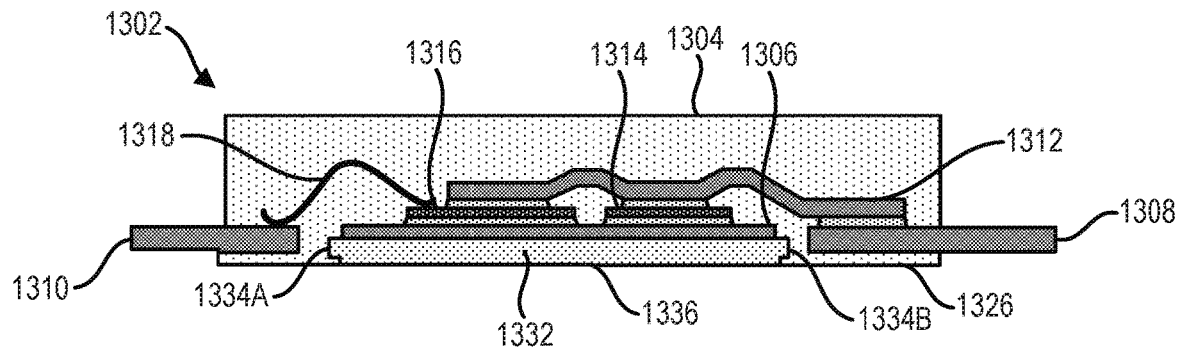

FIGS. 13A-13C illustrate an embodiment of a method of forming a leadframe module at 1300. An embodiment of the method used to form integrated circuit package 1300 is described with respect to FIGS. 9A-9C. Referring to FIG. 13A, a leadframe 1302 includes a die pad 1320. A first semiconductor die 1314 is attached to a top surface 1306 of die pad 1320, and a second semiconductor die 1316 is attached to the top surface 1306 of die pad 1320. First semiconductor die 1314 and second semiconductor die 1316 are attached to leads 1308 via a clip 1312, and second semiconductor die 1316 is attached to leads 1310 via wire bonds 1318. A mold compound 1304 encapsulates the first semiconductor die 1314, the second semiconductor die 1316, and at least a portion of leadframe 1302.

The die pad 1320 includes a bottom surface 1324 exposed at a bottom surface 1326 of the mold compound 1304. Die pad 1320 includes a protruding part 1322A and a protruding part 1322B. The protruding part 1322A extends away from a left side surface of die pad 1320 in a transverse direction from the left side surface, and protruding part 1322B extends away from a right side surface of die pad 1320 in a transverse direction from the right side surface. Protruding parts 1322A and 1322B are below the top surface 1306 of die pad 1320 and are above the bottom surface 1326 of mold compound 1304. In the illustrated embodiment, mold compound 1304 is a polymer mold compound or an epoxy mold compound, and leadframe 1302 and clip 1312 are made of copper (Cu). In other embodiments, leadframe 1302 and clip 1312 can be formed from other suitable materials that include, but are not limited to, aluminum (Al), nickel (Ni), iron (Fe) and steel.

FIG. 13B illustrates an embodiment of forming a cavity 1328 within the bottom surface 1326 of mold compound 1304 by etching the bottom surface 1324 of die pad 1320 to a distance above the bottom surface 1326 of mold compound 1304. At least a portion of the protruding parts 1322A and 1322B of die pad 1320 are etched as illustrated by undercuts 1330A and 1330B. After etching, a bottom surface of die pad is exposed. Etching die pad 1320 includes using an etchant such as copper chloride, iron chloride, HF, NaOH, $HNO_3$, $K_3Fe(CN)_6$, KI and any combination or derivative of these etchants. In other embodiments, other etchants can be used. In other embodiments, any suitable isotropic etchant or anisotropic etchant can be used.

FIG. 13C illustrates an embodiment of filling cavity 1328 with a thermally conductive and electrically insulating isolation layer 1332. In the illustrated embodiment, isolation layer 1332 is a polymer isolation layer. In various embodiments, isolation layer 1332 can be formed from suitable materials that include, but are not limited to, polymer ceramic materials, cement materials and highly filled polymers, such as epoxies, silicones or rubbers, that are filled with silicon dioxide ($SiO_2$), aluminum oxide ($Al_2O_3$), aluminum nitride (AlN), boron nitride (BN), zinc oxide (ZnO) and/or magnesium oxide (MgO). In the illustrated embodiment, isolation layer 1332 has a thickness that is within a range of approximately 100 microns to 500 microns in a direction that is perpendicular to a plane of the bottom surface 1326 of mold compound 1304. In other embodiments, isolation layer 1332 has a thickness that is either less than 100 microns or greater than 500 microns. Filling cavity 1328 with isolation layer 1332 includes filling cavity 1328 with isolation layer 1332 such that all angles between intersecting or adjacent portions of isolation layer 1332 and a cavity 1328 are the same. Isolation layer 1332 includes protrusions 1334A and 1334B that are within or fill respective undercuts 1330A and 1330B. Filling cavity 1328 with isolation layer 1332 includes filling cavity 1328 with isolation layer 1332 such that a bottom surface 1336 of isolation layer 1332 is approximately coplanar with the bottom surface 1326 of mold compound 1304. In other embodiments, bottom surface 1336 of isolation layer 1332 is either below or above the bottom surface 1326 of mold compound 1304.

Figure 14:
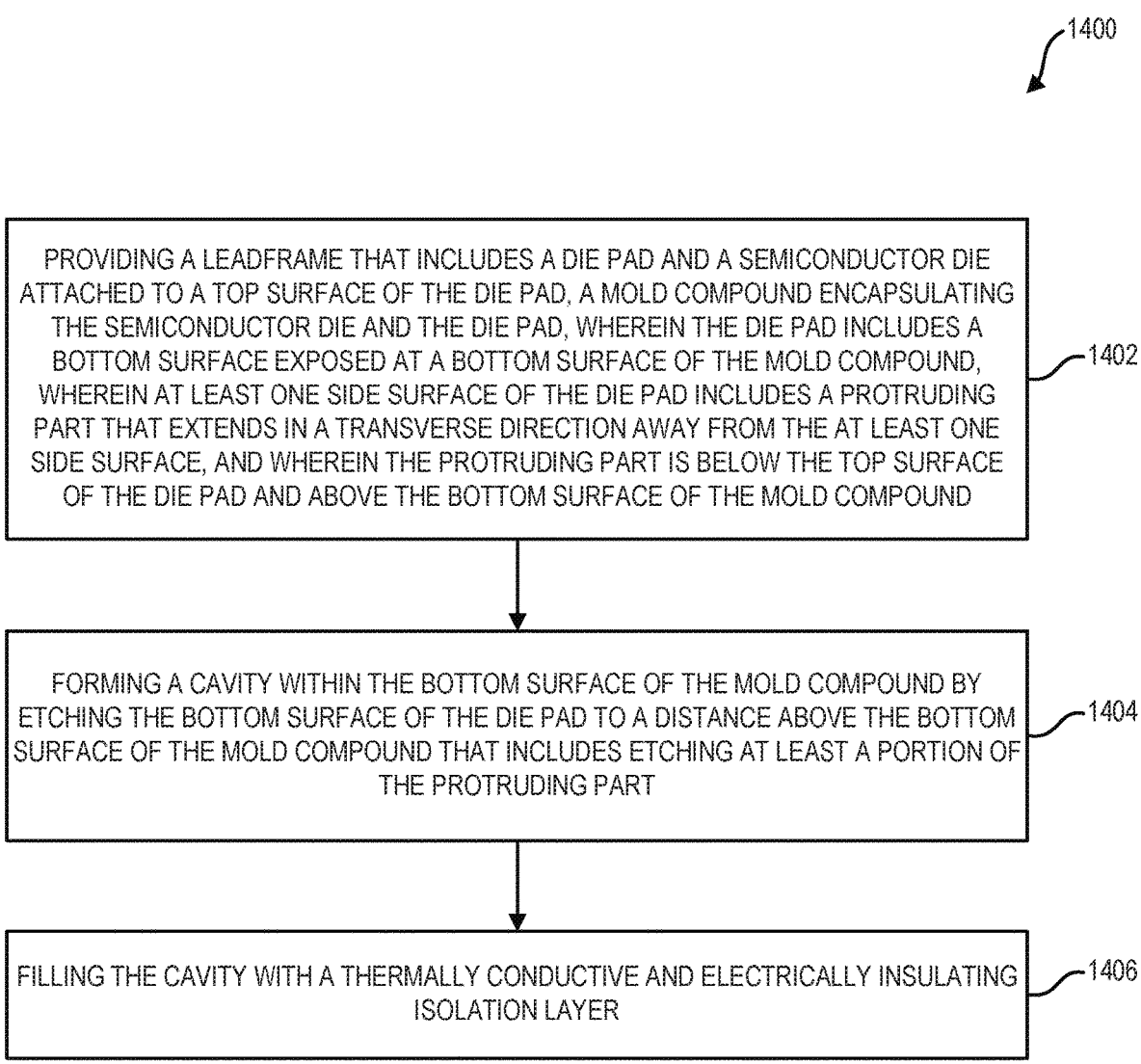
FIG. 14 illustrates an embodiment of a method of forming an integrated circuit package or a leadframe module.
Figure 15:
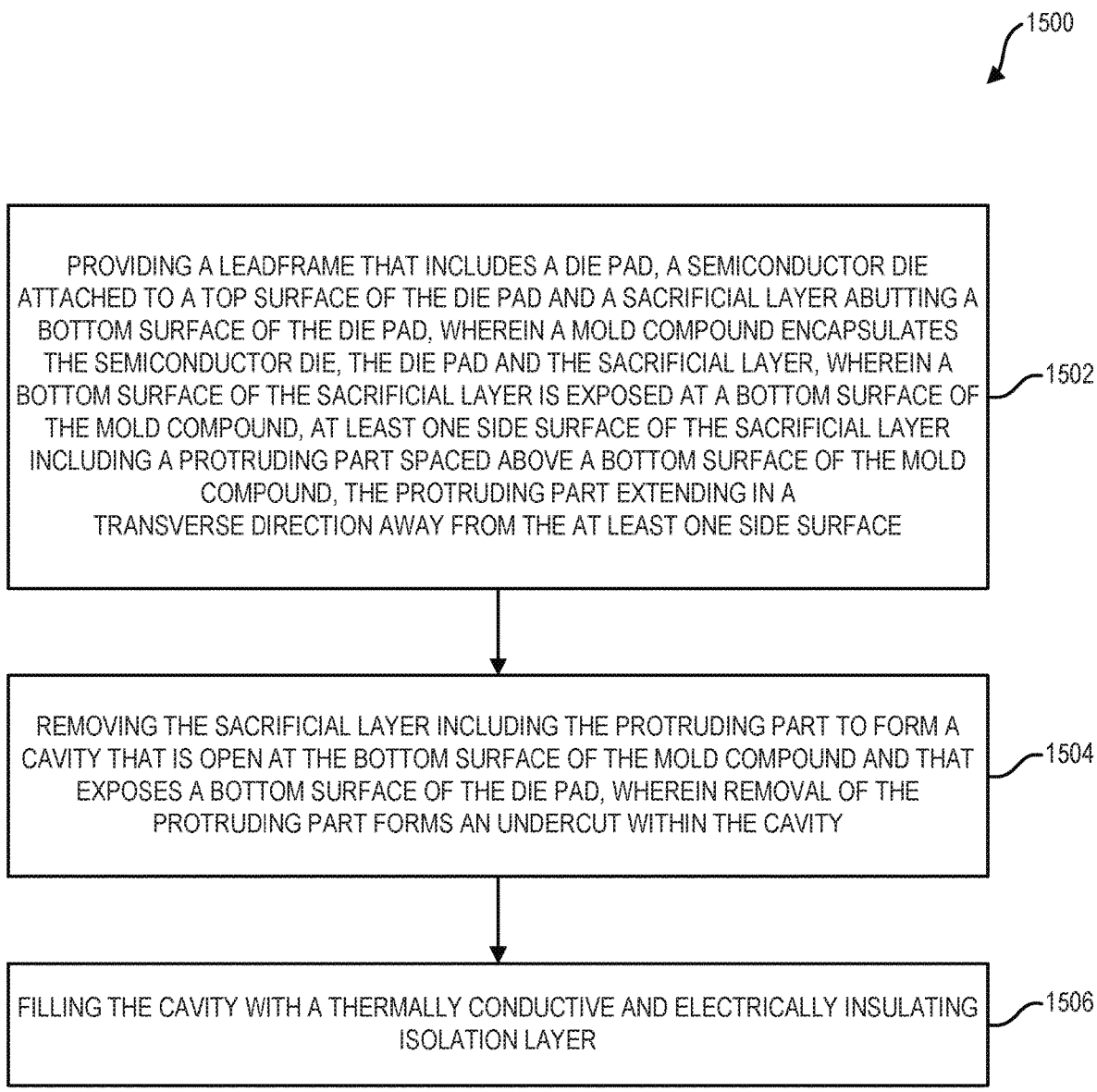
FIG. 15 illustrates an embodiment of a method of forming an integrated circuit package or a leadframe module.

FIG. 14 illustrates an embodiment at 1400 of a method of forming an integrated circuit package or a leadframe module. An embodiment of method 1400 is illustrated in FIGS. 9A-9C. At 1402, the method includes providing a leadframe 902 that includes a die pad 906 and a semiconductor die 910 attached to a top surface 912 of the die pad 902. A mold compound 904 encapsulates the semiconductor die 910 and the die pad 906, where the die pad 906 includes a bottom surface 918 that is exposed at a bottom surface 916 of the mold compound. At least one side surface of the die pad 906 includes a protruding part that extends in a transverse direction away from the at least one side surface (e.g., see protruding parts 920A and 920B). The protruding parts 920A and 920B are below the top surface 912 of die pad 906 and above the bottom surface 916 of the mold compound 904. At 1402, the method includes forming a cavity 930 within the bottom surface 916 of the mold compound 904 by etching the bottom surface 918 of the die pad 906 to a distance above the bottom surface 916 of the mold compound 904 that includes etching at least a portion of the protruding parts 920A and 920B. The method includes filling the cavity with a thermally conductive and electrically insulating isolation layer 924 that includes protrusions 926A and 926B.

FIG. 14 illustrates an embodiment at 1400 of a method of forming an integrated circuit package or a leadframe module. An embodiment of method 1400 is illustrated in FIGS. 9A-9C. At 1402, the method includes providing a leadframe 902 that includes a die pad 906 and a semiconductor die 910 attached to a top surface 912 of the die pad 902. A mold compound 904 encapsulates the semiconductor die 910 and the die pad 906, where the die pad 906 includes a bottom surface 918 that is exposed at a bottom surface 916 of the mold compound. At least one side surface of the die pad 906 includes a protruding part that extends in a transverse direction away from the at least one side surface (e.g., see protruding parts 920A and 920B). The protruding parts 920A and 920B are below the top surface 912 of die pad 906 and above the bottom surface 916 of the mold compound 904. At 1404, the method includes forming a cavity 930 within the bottom surface 916 of the mold compound 904 by etching the bottom surface 918 of the die pad 906 to a distance above the bottom surface 916 of the mold compound 904 that includes etching at least a portion of the protruding parts 920A and 920B. The method includes filling the cavity with a thermally conductive and electrically insulating isolation layer 924 that includes protrusions 926A and 926B.

At 1504, the method includes removing the sacrificial layer 1018 including the protruding parts 1020A and 1020B to form a cavity 1024 that is open at the bottom surface 1016 of the mold compound 1004. A bottom surface 1026 of the die pad is exposed within the cavity 1024. Removal of the protruding parts 1020A and 1020B forms respective undercuts 1028A and 1028B within cavity 1024. At 1506, the method includes filling the cavity with a thermally conductive and electrically insulating isolation layer 1030 that includes protruding parts 1032A and 1032B.

What is claimed is:

1. An integrated circuit package, comprising:
   a leadframe;
   a mold compound encapsulating at least a portion of the leadframe, the mold compound including a cavity open at a bottom surface of the mold compound that exposes a bottom surface of the leadframe;
   a thermally conductive and electrically insulating isolation layer locked within the bottom cavity and contacting the bottom surface of the leadframe, wherein the cavity comprises an etched undercut spaced at a distance above the bottom surface of the mold compound, wherein the isolation layer fills the cavity and the undercut, and wherein the isolation layer filling the undercut locks the isolation layer within the cavity;
   a semiconductor die attached to a top surface of the leadframe;
   a top cavity open at a top surface of the mold compound that includes an etched top undercut at a depth from the top surface of the mold compound, wherein the top cavity is over the semiconductor die; and
   a thermally conductive and electrically insulating top isolation layer filling the top cavity and the top undercut to lock the top isolation layer to the mold compound, wherein the top isolation layer is in thermally conductive contact with a top surface of the semiconductor die.

2. The integrated circuit package of claim 1, wherein the cavity at the bottom surface of the mold compound has a width that is less than a width of the cavity at the distance of the undercut above the bottom surface of the mold compound in a direction that is parallel with a plane of the bottom surface of the mold compound.

3. The integrated circuit package of claim 1, wherein the isolation layer is a polymer isolation layer.

4. The integrated circuit package of claim 1, wherein the mold compound is an epoxy mold compound.

5. The integrated circuit package of claim 1, wherein the leadframe comprises copper (Cu).

6. The integrated circuit package of claim 1, wherein a semiconductor die is attached to a top surface of the leadframe, and wherein the semiconductor die comprises a device selected from a group consisting of a Metal Oxide Semiconductor Field-effect Transistor (MOSFET), an Insulated Gate Bipolar Transistor (IGBT), a Gallium Nitride (GaN) device and a Silicon Carbide (SiC) device.

7. The integrated circuit package of claim 1, further comprising:
   a thermally conductive spacer over the semiconductor die that is in thermally conductive contact with the top surface of the semiconductor die, the top cavity exposing a top surface of the spacer, wherein the top isolation layer contacts the top surface of the spacer.

8. A method of forming the integrated circuit package of claim 1, comprising:
   providing a leadframe that includes a die pad and a semiconductor die attached to a top surface of the die pad, a mold compound encapsulating the semiconductor die and the die pad, wherein the die pad includes a bottom surface exposed at a bottom surface of the mold compound, wherein at least one side surface of the die pad includes a protruding part that extends in a transverse direction away from the at least one side surface, and wherein the protruding part is below the top surface of the die pad and above the bottom surface of the mold compound;
   forming a cavity within the bottom surface of the mold compound by etching the bottom surface of the die pad to a distance above the bottom surface of the mold compound that includes etching at least a portion of the protruding part; and
   filling the cavity with a thermally conductive and electrically insulating isolation layer.

9. The method of claim 8, wherein etching the bottom surface of the die pad comprises using an etchant selected from a group of etchants consisting of copper chloride, iron chloride, HF, NaOH, $HNO_3$, $K_3Fe(CN)_6$, KI and any combination or derivative of these etchants.

10. The method of claim 8, wherein filling the cavity with the isolation layer comprises filling the cavity with a polymer isolation layer such that a lower surface of the polymer isolation layer is approximately coplanar with the bottom surface of the mold compound.

11. The method of claim 8, wherein filling the cavity with the isolation layer comprises filling the cavity with a polymer isolation layer using an inkjet process.

12. The method of claim 8, further comprising:
etching a top cavity within a top surface of the mold compound that is over the semiconductor die, the top cavity including an etched undercut below the top surface of the mold compound; and
filling the top cavity with a thermally conductive and electrically insulating top isolation layer, wherein the top isolation layer is in thermally conductive contact with a top surface of the semiconductor die.

13. The method of claim 12, further comprising:
providing a thermally conductive spacer over the semiconductor die that is in thermally conductive contact with the top surface of the semiconductor die, wherein the spacer is encapsulated by the mold compound and includes a top surface exposed at the top surface of the mold compound, wherein at least one side surface of the spacer includes a protruding part that extends in a transverse direction away from the at least one side surface of the spacer, wherein the protruding part is below the top surface of the mold compound, and
wherein etching the top cavity within the top surface of the mold compound comprises etching the top surface of the spacer to a depth that includes etching at least a portion of the protruding part of the spacer.

14. A leadframe module, comprising:
a leadframe with a first die pad and a second die pad, a first power semiconductor die attached to a top surface of the first die pad and a second power semiconductor die attached to a top surface of the second die pad;
a mold compound encapsulating the first power semiconductor die, the second power semiconductor die, and at least a portion of the leadframe,
the mold compound including a first cavity open at a bottom surface of the mold compound that exposes a bottom surface of the first die pad, the first cavity including an etched first undercut spaced at a first distance above the bottom surface of the mold compound, wherein a thermally conductive and electrically insulating first isolation layer fills the first cavity and the first undercut, and wherein the first isolation layer filling of the first undercut locks the first isolation layer within the first cavity,
the mold compound including a second cavity open at the bottom surface of the mold compound that exposes a bottom surface of the second die pad, the second cavity including an etched second undercut spaced at a second distance above the bottom surface of the mold compound, wherein a thermally conductive and electrically insulating second isolation layer fills the second cavity and the second undercut, and wherein the second isolation layer filling the second undercut locks the second isolation layer within the second cavity.

15. The leadframe module of claim 14, wherein the first distance of the first undercut is approximately equal to a distance between the bottom surface of the first die pad and the bottom surface of the mold compound, and wherein the second distance of the second undercut is approximately equal to a distance between the bottom surface of the second die pad and the bottom surface of the mold compound.

16. The leadframe module of claim 14, wherein a lower surface of the first isolation layer is approximately coplanar with the bottom surface of the mold compound, and wherein a lower surface of the second isolation layer is approximately coplanar with the bottom surface of the mold compound.

17. The leadframe module of claim 14, wherein one of a lower surface of the first isolation layer and a lower surface of the second isolation layer is approximately coplanar with the bottom surface of the mold compound, and wherein the other one of the lower surface of the first isolation layer and the lower surface of the second isolation layer is below the bottom surface of the mold compound.

18. A method of forming an integrated circuit package including the leadframe module of claim 14, comprising:
providing a leadframe that includes a die pad, a semiconductor die attached to a top surface of the die pad and a sacrificial layer abutting a bottom surface of the die pad, wherein a mold compound encapsulates the semiconductor die, the die pad and the sacrificial layer, wherein a bottom surface of the sacrificial layer is exposed at a bottom surface of the mold compound, at least one side surface of the sacrificial layer including a protruding part spaced above a bottom surface of the mold compound, the protruding part extending in a transverse direction away from the at least one side surface;
removing the sacrificial layer including the protruding part to form a cavity that is open at the bottom surface of the mold compound and that exposes a bottom surface of the die pad, wherein removal of the protruding part forms an undercut within the cavity;
filling the cavity with a thermally conductive and electrically insulating isolation layer.

19. The method of claim 18, wherein the sacrificial layer comprises a water-soluble polymer, and wherein removing the sacrificial layer comprises using a water solution to dissolve the water-soluble polymer to remove the water-soluble polymer from the cavity.

20. The method of claim 18, wherein the sacrificial layer comprises an alcohol-soluble polymer, and wherein removing the sacrificial layer comprises using an alcohol solution to dissolve the alcohol-soluble polymer to remove the alcohol-soluble polymer from the cavity.

21. The method of claim 18, wherein the sacrificial layer comprises a deformable material having a hardness that is less than the hardness of the mold compound, and wherein removing the sacrificial layer comprises peeling the deformable material out of the cavity.

22. The method of claim 18, wherein the sacrificial layer comprises a polymer layer, and wherein removing the sacrificial layer comprises:
heating the polymer layer to a temperature at which the polymer layer transits from a crystalline state into a viscous flow state; and
draining the polymer out of the cavity.

23. The method of claim 18, wherein the sacrificial layer comprises aluminum (Al) and the leadframe comprises copper (Cu), and wherein removing the sacrificial layer comprises removing the aluminum using a wet etching solution that is selective to removing the aluminum while suppressing removal of the copper.

24. The method of claim 18, wherein the sacrificial layer comprises tin (Sn) and the leadframe comprises copper (Cu), and wherein removing the sacrificial layer comprises removing the tin using a wet etching solution that is selective to removing the tin while suppressing removal of the copper.

25. The method of claim 18, wherein the sacrificial layer comprises copper oxide (CuO) and the leadframe comprises copper (Cu), and wherein removing the sacrificial layer comprises removing the copper oxide using a wet etching solution that is selective to removing the copper oxide while suppressing removal of the copper.

26. The method of claim 18, wherein the sacrificial layer comprises nickel (Ni) and the leadframe comprises copper (Cu), and wherein removing the sacrificial layer comprises removing the nickel using a wet etching solution that is selective to removing the nickel while suppressing removal of the copper.

27. The method of claim 18, further comprising:
- providing a top sacrificial layer encapsulated by the mold compound and that is over a top surface of the semiconductor die, a top surface of the top sacrificial layer exposed at a top surface of the mold compound, at least one side surface of the top sacrificial layer including a protruding part spaced below the top surface of the mold compound, the protruding part extending in a transverse direction away from the at least one side surface;
- removing the top sacrificial layer including the protruding part to form a top cavity that is open at the top surface of the mold compound, wherein removal of the protruding part forms an undercut within the top cavity;
- filling the top cavity with a thermally conductive and electrically insulating top isolation layer.

28. The method of claim 27, further comprising:
- providing a thermally conductive spacer over the semiconductor die that is in thermally conductive contact with a top surface of the semiconductor die, wherein the spacer is encapsulated by the mold compound;
- wherein removing the top sacrificial layer comprises exposing a top surface of the spacer at a bottom surface of the top cavity; and
- wherein filling the top cavity with the top isolation layer comprises a bottom surface of the top isolation layer contacting the top surface of the spacer.

* * * * *